(12) United States Patent
Taniguchi et al.

(10) Patent No.: US 8,259,375 B2
(45) Date of Patent: Sep. 4, 2012

(54) CRYSTALLIZATION APPARATUS, CRYSTALLIZATION METHOD, DEVICE AND PHASE MODULATION ELEMENT

(75) Inventors: Yukio Taniguchi, Yokohama (JP); Masakiyo Matsumura, Yokohama (JP); Noritaka Akita, Yokohama (JP)

(73) Assignee: Dai Nippon Printing Co., Ltd., Tokyo-To (JP)

(*) Notice: Subject to any disclaimer, the term of this patent is extended or adjusted under 35 U.S.C. 154(b) by 18 days.

(21) Appl. No.: 12/773,577

(22) Filed: May 4, 2010

(65) Prior Publication Data
US 2010/0214641 A1    Aug. 26, 2010

Related U.S. Application Data

(62) Division of application No. 11/681,030, filed on Mar. 1, 2007, now Pat. No. 7,803,520, which is a division of application No. 10/949,417, filed on Sep. 27, 2004, now Pat. No. 7,214,270.

(30) Foreign Application Priority Data

Sep. 30, 2003   (JP) .................................. 2003-339363

(51) Int. Cl.
*G03H 1/00* (2006.01)
*G02B 26/00* (2006.01)
*G02F 1/01* (2006.01)
*G01J 1/32* (2006.01)
*G01J 1/00* (2006.01)
*H01L 21/20* (2006.01)

(52) U.S. Cl. ............ 359/1; 359/238; 359/279; 250/205; 356/121; 430/320

(58) Field of Classification Search .................. 359/238, 359/279, 293–294, 297, 19; 250/205; 356/121, 356/363

See application file for complete search history.

(56) References Cited

U.S. PATENT DOCUMENTS
7,063,478 B2    6/2006   Taniguchi et al.
(Continued)

FOREIGN PATENT DOCUMENTS
EP           1 047 119 A2   10/2000
(Continued)

OTHER PUBLICATIONS

Light Intensity Distribution for Large Grain-Growth by Phase-Modulated Excimer-Laser Annealing; Jyumonji, et al.; Advanced LCD Technologies Development Center Co., Ltd; pp. 153-156, (2003).

(Continued)

*Primary Examiner* — Dawayne A Pinkney
(74) *Attorney, Agent, or Firm* — Oblon, Spivak, McClelland, Maier & Neustadt, L.L.P.

(57) ABSTRACT

The present invention comprises a light modulation optical system having a first element which forms a desired light intensity gradient distribution to an incident light beam and a second element which forms a desired light intensity minimum distribution with an inverse peak shape to the same, and an image formation optical system which is provided between the light modulation optical system and a substrate having a polycrystal semiconductor film or an amorphous semiconductor film, wherein the incident light beam to which the light intensity gradient distribution and the light intensity minimum distribution are formed is applied to the polycrystal semiconductor film or the amorphous semiconductor film through the image formation optical system, thereby crystallizing a non-crystal semiconductor film. The pattern of the first element is opposed to the pattern of the second element.

2 Claims, 21 Drawing Sheets

U.S. PATENT DOCUMENTS

| | | |
|---|---|---|
| 7,214,270 B2 | 5/2007 | Taniguchi et al. |
| 7,227,679 B2 | 6/2007 | Taniguchi |
| 7,239,374 B2 | 7/2007 | Taniguchi et al. |
| 7,459,026 B2 | 12/2008 | Taniguchi et al. |
| 7,540,921 B2 | 6/2009 | Matsumura et al. |
| 2004/0005744 A1 | 1/2004 | Taniguchi et al. |
| 2004/0036969 A1 | 2/2004 | Taniguchi et al. |
| 2004/0066569 A1* | 4/2004 | Taniguchi ............... 359/883 |
| 2004/0126919 A1 | 7/2004 | Taniguchi et al. |
| 2004/0161676 A1* | 8/2004 | Taniguchi et al. ............ 430/5 |
| 2004/0214414 A1 | 10/2004 | Matsumura et al. |
| 2006/0213431 A1 | 9/2006 | Taniguchi et al. |
| 2007/0188840 A1 | 8/2007 | Taniguchi |
| 2007/0201014 A1 | 8/2007 | Taniguchi et al. |
| 2007/0211327 A1 | 9/2007 | Taniguchi et al. |
| 2009/0166624 A1 | 7/2009 | Matsumura et al. |
| 2009/0203231 A1 | 8/2009 | Matsumura et al. |

FOREIGN PATENT DOCUMENTS

| | | |
|---|---|---|
| JP | 2000-306859 | 11/2000 |

OTHER PUBLICATIONS

Excimer laser-induced temperature field in melting an resolidification of silicon thin films; Hatano, et al; Journal of Applied Physics; vol. 87, No. 1; pp. 36-43, (2000).

Kohki Inoue, et al., "Amplitude and Phase Modulated Excimer-Laser Melt-Regrowth Method of Silicon Thin-Films—A New Growth Method of 2-D Position-Controlled Large-Grains—" IEICE (The Institute of Electronics, Information and Communication Engineers), Transactions C, vol. J85-C, No. 8, Aug. 2002, pp. 624-629.

Masayiko Matsumura, "Preparation of Ultra-Large Grain Silicon Thin-Films by Excimer-Laser", Journal of the Surface Science Society of Japan, vol. 21, No. 5, 2000, pp. 278-287.

M. Nakata, et al., "Two-Dimensionally Position-Controlled Ultra-Large Grain Growth Based on Phase-Modulated Excimer-Laser Annealing Method", Electrochemical Society Proceeding, vol. 2000-31, pp. 148-154.

Y. Sano et al., "Highly Packed and Ultra-Large Si Grains Grown by a Single-Shot Irradiation of Excimer-Laser Light Pulse", Electrochemical Society Proceeding, vol. 2000-31, pp. 261-268.

Matsumura "Advanced excimer laser recrystallization technology for crystal-Si thin film devices", Mat. Res. Soc. Symp. Proc., vol. 685E, pp. D4.1.1-D4.1.11 (2001).

Oh, et al. "A projection type excimer laser crystallization system for ultra-large grain growth of Si thin films", Mat. Res. Soc. Symp. Proc. vol. 558, pp. 187-192 (2000).

Nakata, et al. "A nucleation site control excimer laser crystallization methods", Jpn. J. Appl. Phys., Part 1, vol. 40 (5A), pp. 3049-3054 (May 2001).

Lee, et al., "Relationship between fluence gradient and lateral grain growth in . . . " J. Appl. Phys., vol. 88(9), pp. 4994-4999, (Nov. 2000).

* cited by examiner

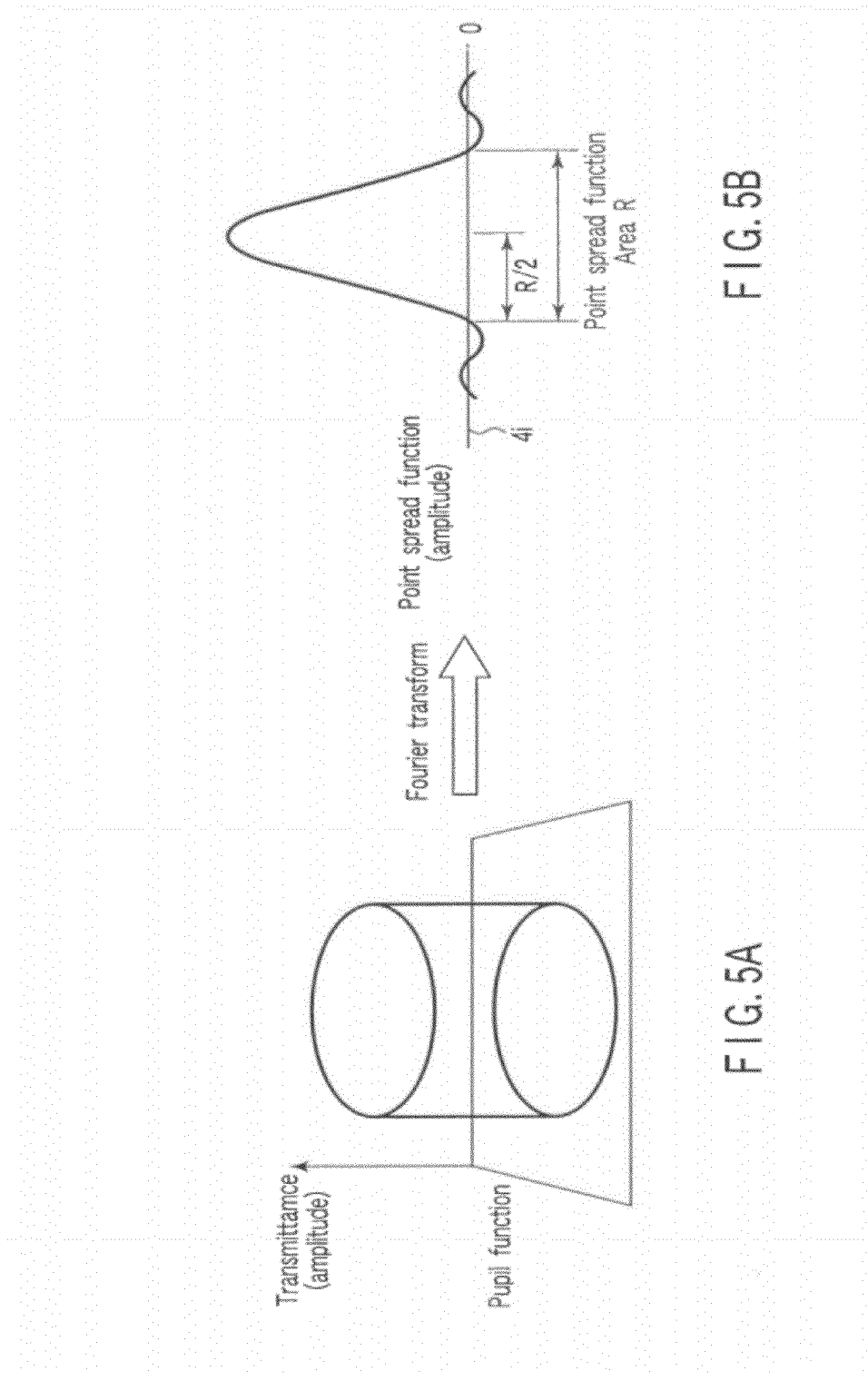

FIG. 6B  Light intensity distribution at cross section A-A

Light intensity distribution at cross section B-B

FIG. 10B  Light intensity distribution at cross section A-A

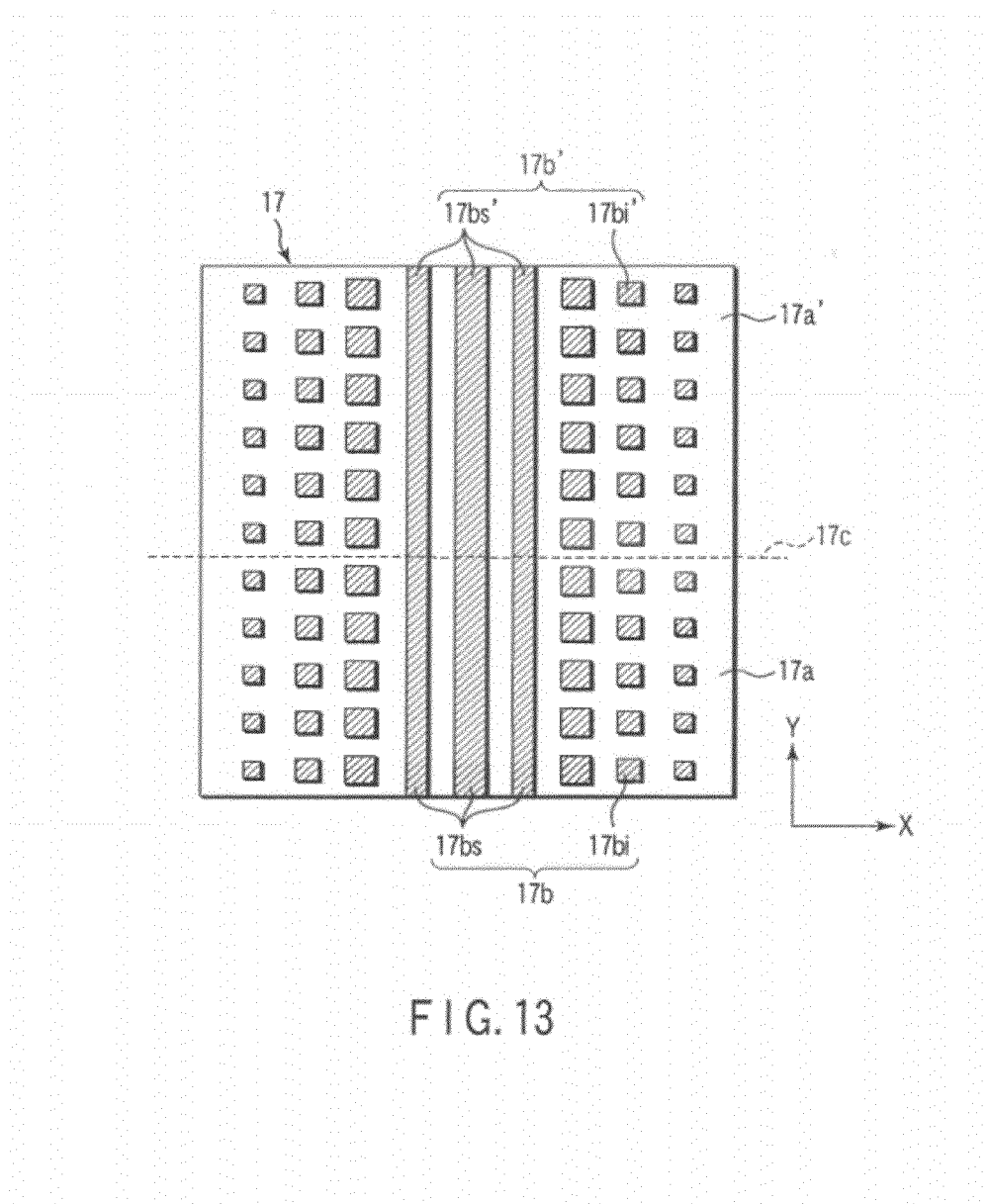
F I G. 13

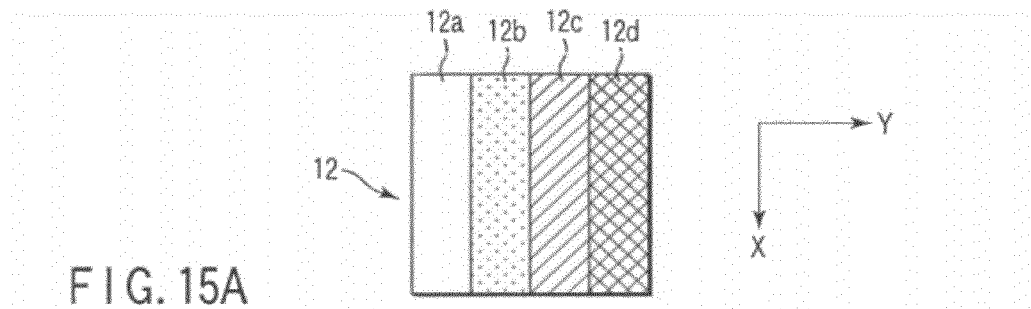
F I G. 15A
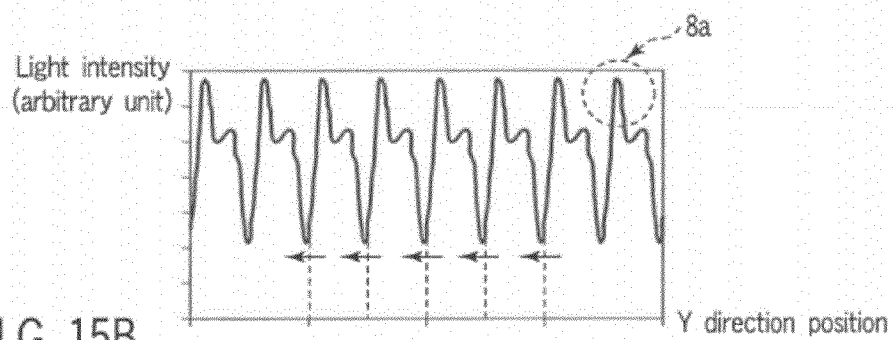
F I G. 15B
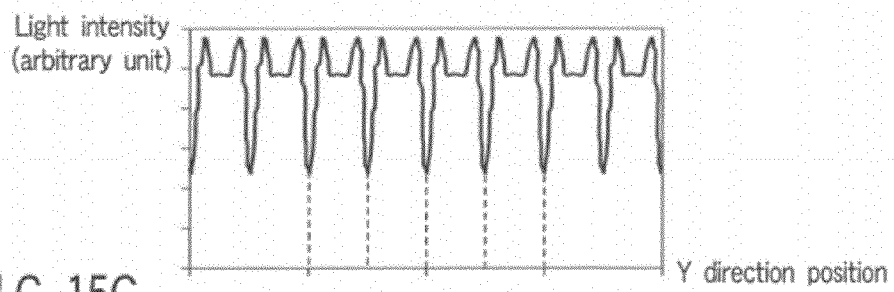
F I G. 15C
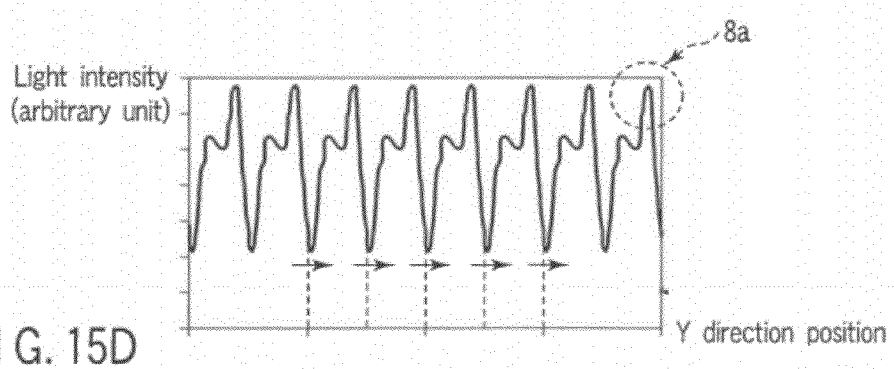
F I G. 15D

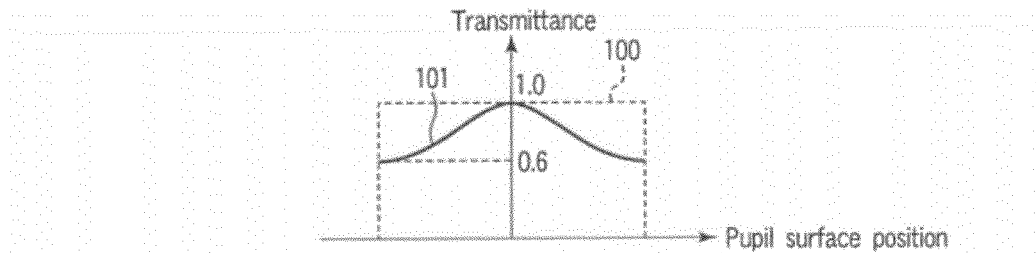
F I G. 16A
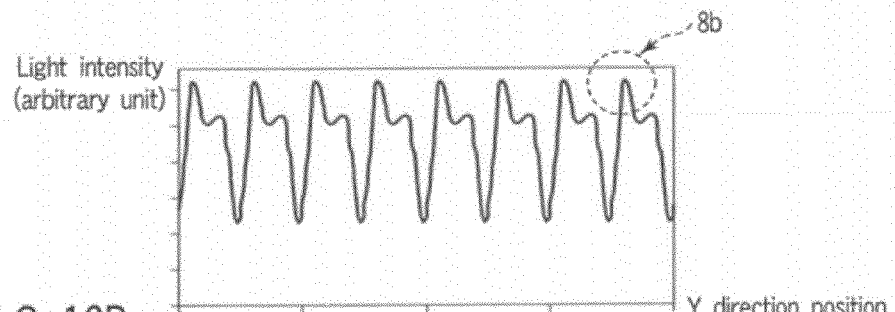
F I G. 16B
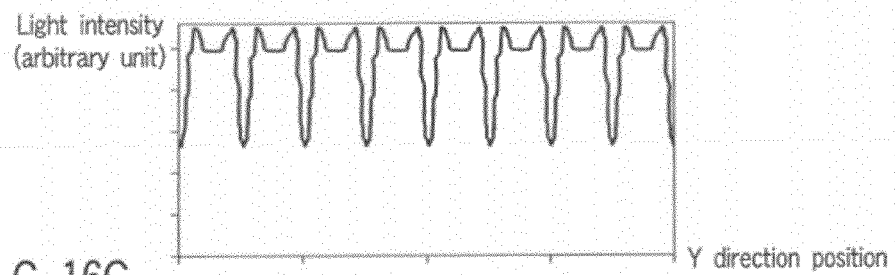
F I G. 16C
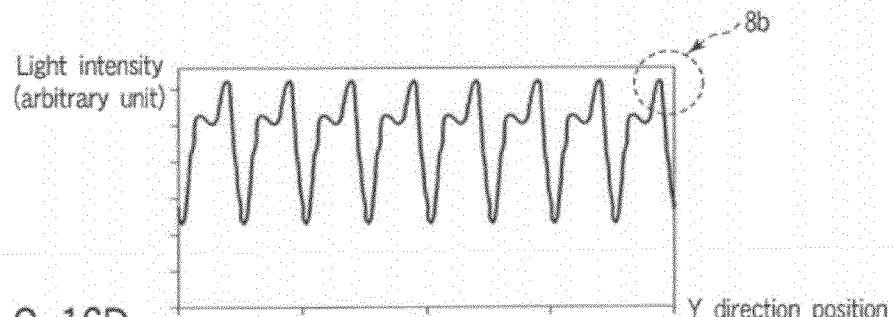
F I G. 16D

CRYSTALLIZATION APPARATUS, CRYSTALLIZATION METHOD, DEVICE AND PHASE MODULATION ELEMENT

CROSS-REFERENCE TO RELATED APPLICATIONS

This application is a Divisional of application Ser. No. 11/681,030, filed Mar. 1, 2007, which is a Divisional of application Ser. No. 10/949,417, filed Sep. 27, 2004, which is based upon and claims the benefit of priority from the prior Japanese Patent Application No. 2003-339363, filed Sep. 30, 2003, the entire contents of which are incorporated herein by reference.

BACKGROUND OF THE INVENTION

1. Field of the Invention

The present invention relates to a crystallization apparatus which crystallizes a non-crystal semiconductor film with irradiating laser beam to a film made of polycrystal semiconductor or an amorphous semiconductor, a phase modulation element used in this crystallization apparatus, a crystallization method, and a device. In particular, the present invention relates to a crystallization apparatus which crystallizes a non-crystal semiconductor film, such as a polycrystal semiconductor or an amorphous semiconductor, with irradiating laser beam having a predetermined light intensity distribution subjected to phase modulation by using a phase modulation element to a film made of polycrystal semiconductor or an amorphous semiconductor, a phase modulation element used in this crystallization apparatus, a crystallization method, and a device.

2. Description of the Related Art

Conventionally, a thin film transistor (TFT) is used for, e.g., a switching element which controls a voltage applied to pixels in, e.g., a liquid crystal display (LCD). This thin film transistor is formed on an amorphous silicon layer or a polysilicon layer.

The polysilicon layer has a higher mobility of electrons and holes than that of the amorphous silicon layer. Therefore, when a transistor is formed on the polysilicon layer, the switching speed is increased as compared with a case that a transistor is formed on the amorphous silicon layer. Further, the response speed of a display is improved. Further, a peripheral LSI can be constituted of thin film transistors. Furthermore, there is an advantage that the design margin of any other component can be reduced. Moreover, when peripheral circuits such as a driver circuit or a DAC are incorporated in a display, these peripheral circuits can be operated at a higher speed.

Although the polycrystal silicon is formed of an aggregation of crystal grains, it has a lower mobility of electrons and holes than that of single-crystal silicon. Additionally, many thin film transistors formed on the polycrystal silicon have a problem of irregularities in crystal grain boundary number in a channel portion. Thus, in order to improve the mobility of electrons and holes and reduce irregularities in crystal grain boundary number in the channel portion, there has been proposed a crystallization method which generates crystallized silicon with a large grain size.

Conventionally, as this type of crystallization method, there is known a phase control excimer laser annealing (ELA) method which generates a crystallized semiconductor film by irradiating a phase shifter approximated to a polycrystal semiconductor film or an amorphous semiconductor film in parallel with an excimer laser beam. The detail of the phase control ELA method is disclosed in, e.g., "Journal of the Surface Science Society of Japan, Vol. 21, No. 5, pp. 278-287, 2000".

In the phase control ELA method, a light intensity distribution with an inverse peak pattern (pattern that a light intensity is minimum at the center and the light intensity is suddenly increased toward the periphery) that a light intensity is lower at a point corresponding to a phase shift portion of a phase shifter as compared with the periphery is generated. Further, a polycrystal semiconductor film or an amorphous semiconductor film is irradiated with a light beam having this light intensity distribution with the inverse peak pattern. As a result, a temperature gradient is generated in a melting area in accordance with the light intensity distribution. A crystal nucleus is formed at a part which is solidified first or which is not melted in accordance with a point where the light intensity is minimum. A crystal grows in the lateral direction from the crystal nucleus toward the periphery (which will be referred to as a "lateral growth" or a "lateral-directional growth" hereinafter), thereby producing single crystal grains with a large grain size.

Conventionally, in "Electrochemical Society Proceeding Volume 2000-31, page 148-154, 261-268", for example, an element having a pattern which forms a V-shaped light intensity gradient distribution (which is determined as a mask #2) and an element having a pattern which forms a light intensity minimum distribution with an inverse peak shape (which is determined as a mask #1) are both realized by providing phase steps on a substrate of $SiO_2$. Furthermore, a non-crystal semiconductor film is crystallized on a substrate (a substrate to be processed) with irradiating an excimer laser beam in a state that the two elements are in closer vicinity to the substrate.

Therefore, at a crystallization step, when an ablation phenomenon is generated from a substrate, an evaporant adheres to an opposed surface of the mask 1 to which the substrate is opposed. At the next step after the evaporant has adhered, irregularities are produced in a light intensity distribution formed by the mask #1 and the mask #2, and a crystallized area and a crystallized shape become disordered. Moreover, in regard to application of a laser beam with the mask 1 and mask 2 being in close vicinity to the substrate, an operation which always maintains a distance of several μm order between the mask #1 and the substrate constant requires a long time, thereby relatively delaying a tact time.

Additionally, in "IEICE (The Institute of Electronics, Information and Communication) transactions Vol. J85-C, No. 8, p. 624-629, August 2002", an element having a pattern which forms, e.g., a V-shaped light intensity gradient distribution is realized by a thickness distribution of a light absorption material SiONx, and an element having a pattern which forms a light intensity minimum distribution with an inverse peak shape is realized by phase steps of $SiO_2$. However, these two elements are laminated and formed on one substrate. Further, a crystallized semiconductor film is generated on a substrate with irradiating an excimer laser beam in a state that the substrate is in close vicinity to this one element substrate.

Furthermore, in Jpn. Pat. Appln. KOKAI Publication No. 2000-306859, an image formation optical system is arranged between a phase shifter having a line-and-space pattern whose phase difference is 180 degrees and a substrate. Moreover, a crystallized semiconductor film is generated on the substrate with irradiating a light beam having a light intensity distribution with an inverse peak pattern generated through the phase shifter to the substrate through the image formation optical system.

However, in the conventional technique (proximity method) by which a substrate is in close proximity to an element, the element is contaminated due to ablation in a semiconductor film, which obstructs the excellent crystallization. Additionally, the substrate and the element must be separated from each other every time processing moves to another processing area on the substrate, which prolongs the processing time. Further, since a gap which should be set between the element and the substrate is very small, a detection light beam for position detection is hard to be led into this narrow light path, and a gap adjustment is difficult.

On the other hand, in the conventional technique using a phase shifter having a line-and-space pattern whose phase difference is 180 degrees, a trough portion in a formed light intensity distribution with an inverse peak pattern becomes too deep. In this case, since a crystal does not grow unless a light intensity is not less than a predetermined threshold value, an uncrystallized area becomes too large, and a crystallized semiconductor film with a large grain size cannot be generated. Furthermore, it is impossible to obtain a large gradient of a light intensity distribution pattern with an inverse peak pattern in order to perform crystallization with a large grain size.

BRIEF SUMMARY OF THE INVENTION

In view of the above-described drawbacks, it is an object of the present invention to provide a crystallization apparatus and a crystallization method which can obtain a light intensity distribution having a desired gradient for performing crystallization with a large grain size, and can realize a sufficient crystal growth in a lateral direction from a crystal nucleus, thereby crystallizing a non-crystal semiconductor film with a large grain size.

Here, a polycrystal semiconductor includes fine crystal structures, however, desired crystal structure with excellent electrical properties is different from polycrystal structure. Therefore, polycrystal is close to amorphous structure, we categorize polycrystal in non-crystal semiconductor.

To achieve this aim, according to the first aspect of the present invention, there is provided a crystallization apparatus comprising:

a light modulation optical system having a first element which forms a desired light intensity gradient distribution to an incident light beam and a second element which forms a desired light intensity minimum distribution with an inverse peak shape to the same; and an image formation optical system which is provided between the light modulation optical system and a substrate having a film made of polycrystal semiconductor or an amorphous semiconductor, wherein the incident light beam to which the light intensity gradient distribution and the light intensity minimum distribution are formed is applied to the film through the image formation optical system, thereby crystallizing a non-crystal semiconductor film.

In this case, wherein the first element has a first pattern which forms the light intensity gradient distribution, it is preferable that the first pattern of the first element is opposed to the second pattern of the second element.

In the first aspect of the present invention, a combined light intensity distribution obtained from a light intensity gradient distribution formed through the first element and a light intensity minimum distribution with an inverse peak shape formed through the second element is formed on a surface of the substrate. As a result, a crystal nucleus formation position, i.e., a crystal growth start point can be approximated to a position where the light intensity is minimum in the light intensity minimum distribution with the inverse peak shape as much as possible. Moreover, a sufficient crystal growth in a lateral direction from a crystal nucleus can be realized along a gradient direction of the light intensity in the intensity gradient distribution, thereby crystallizing a non-crystal semiconductor film with a large grain size. At this time, in the first aspect of the present invention, as different from the proximity method, since an image formation optical system is interposed between the first element or the second element and the substrate and a relatively large gap is assured between the substrate and the image formation optical system, the first element and the second element or the image formation optical system do not undergo adhesion due to ablation in the substrate, and the excellent crystallization can be realized. Additionally, since a relatively large gap is assured between the substrate and the image formation optical system, the substrate and the image formation optical system do not have to be separated from each other even when processing moves to another processing area on the substrate, thereby realizing processing with a high throughput. Further, since a relatively large gap is assured between the substrate and the image formation optical system, a detection light beam for position detection can be lead into a light path between these members, thereby facilitating adjustment of a positional relationship between the substrate and the image formation optical system.

According to the second aspect of the present invention, there is provided a crystallization apparatus comprising:

an element having a combined pattern in which a first pattern for forming the light intensity gradient distribution is combined with a second pattern for forming the light intensity minimum distribution; and an image formation optical system provided between the element and a substrate having a film made of polycrystal semiconductor or an amorphous semiconductor, wherein an incident light beam to which the light intensity gradient distribution and the light intensity minimum distribution are formed by the combined pattern is applied to the film through the image formation optical system, thereby crystallizing a non-crystal semiconductor film.

In this case, it is preferable that each of a pattern for forming the light intensity gradient distribution and a pattern for forming the light intensity minimum distribution is a phase modulation pattern and that a phase modulation quantity of the combined pattern corresponds to a sum of a phase modulation quantity of the first pattern for forming the light intensity gradient distribution and a phase modulation quantity of the second pattern for forming the light intensity minimum distribution.

In the second aspect of the present invention, one element having the combined pattern obtained from the first pattern for forming the light intensity gradient distribution and the second pattern for forming the light intensity minimum distribution with the inverse peak shape is used in place of the first element and the second element in the first aspect. As a result, in the second aspect of the present invention, not only the effect of the first aspect mentioned above can be obtained, but there is an advantage that the number of times of positioning can be reduced by performing positioning of one element only.

According to the preferred first and second aspects, the first pattern for forming the light intensity gradient distribution has a phase distribution in which area share ratios of a first area whose minimum dimension is optically smaller than a radius of a point spread distribution range of the image formation optical system and which has a first phase value and a second area having a second phase value vary depending on each position. With such a structure, a light intensity distribution in a free conformation can be generated.

In this case, the light intensity gradient distribution is a V-shaped light intensity distribution having a three-dimensional shape in which the V shape having a gradient in a given one-dimensional direction (e.g., an X direction) is formed along a predetermined direction (e.g., a Y direction). It is preferable that the first pattern for forming the light intensity gradient distribution has a linear area (it does not have to be a completely straight line, and a substantially linear shape can suffice) extending along a direction parallel to a bottom of the V-shaped light intensity distribution at a part corresponding to this bottom, and has an isolated area at a part distanced from the part corresponding to the bottom of the V-shaped light intensity distribution. In this structure, since even optical characteristics can be obtained along the bottom of the light intensity gradient distribution due to the effect of the linear area, there is an advantage that the optical characteristics of the obtained combined light intensity distribution hardly fluctuate even if positioning of the first element and the second element is displaced in a predetermined direction.

Furthermore, according to the preferred first and second aspects, the second pattern for forming the light intensity minimum distribution has a plurality of strip-like areas extending in a gradient direction of the light intensity in the light intensity gradient distribution, and strip-like areas adjacent to each other have different phase values. In this case, it is preferable that the plurality of strip-like areas have three or more types of strip-like areas having different phase values and that a difference in phase value of two strip-like areas adjacent to each other has substantially the same value including a sign in one direction. In this structure, even if the surface of the substrate is defocused with respect to the second pattern surface of the second element, peak points in the light intensity minimum distribution having the inverse peak shape are maintained in an equal interval state. As a result, intervals between central positions of generated crystal grains become equal, and crystal grains having the same shape are thereby aligned along the Y direction, which is advantageous in producing a thin film transistor (TFT) on each crystal grain.

Moreover, according to the preferred first and second aspects, the second pattern for forming the light intensity minimum distribution has a conformation in which three or more types of areas having different phase values are adjacent to each other at predetermined points. In this structure, a light intensity minimum distribution having a point inverse peak shape is generated on a bottom portion of the light intensity gradient distribution only in accordance with a desired conformation, and the light intensity distribution which is ideal for positioning a crystal growth start point can be obtained. Additionally, in the first and second aspects, it is preferable that a pupil function of the image formation optical system is smaller at the periphery than that at the center. In this structure, unnecessary peaks generated at the periphery of the light intensity minimum distribution with the inverse peak shape obtained in the defocus state can be reduced or eliminated, and collapses of symmetry of the light intensity minimum distribution in the defocus state can be greatly eased.

According to the third aspect of the present invention, there is provided a crystallization method comprising:

illuminating with an incident light beam a light modulation element which has a first element forming a light intensity gradient distribution and a second element forming a light intensity minimum distribution with an inverse peak shape; and irradiating the incident light beam having the light intensity gradient distribution and the light intensity minimum distribution formed thereto to a film made of polycrystal semiconductor or an amorphous semiconductor through an image formation optical system provided between the light modulation optical system and a substrate having the film, thereby crystallizing a non-crystal semiconductor film.

According to the fourth aspect of the present invention, there is provided a crystallization method comprising:

illuminating with an incident light beam an element having a combined pattern obtained from a first pattern forming a light intensity gradient distribution and a second pattern forming a light intensity minimum distribution; and irradiating the incident light beam having the light intensity gradient distribution and the light intensity minimum distribution formed thereto to a film made of polycrystal semiconductor or an amorphous semiconductor film through an image formation optical system provided between the element and the film, thereby crystallizing a non-crystal semiconductor film.

According to the fifth aspect of the present invention, there is provided a device which is manufactured by using the crystallization apparatus according to the first aspect or the second aspect or the crystallization method according to the third aspect or the fourth aspect. In this case, an excellent semiconductor device, a liquid crystal display device or the like can be manufactured based on a crystallized semiconductor film with a large grain size obtained by realizing the sufficient lateral growth from a crystal nucleus.

According to the sixth aspect of the present invention, there is provided a phase modulation element having a pattern which forms a light intensity minimum distribution with an inverse peak shape to an incident light beam, wherein the pattern has three or more types of strip-like areas having different phase values, and a difference in phase value of the two strip-like areas adjacent to each other has substantially the same value including a sign in one direction.

According to the seventh aspect of the present invention, there is provided a phase modulation element having a pattern which forms a V-shaped light intensity distribution to an incident light beam, wherein the phase modulation element has a first area whose minimum dimension is smaller than a predetermined dimension and which has a first phase value and a second area having a second phase value, and has a phase distribution in which area share ratios of the first area and the second area vary depending on positions, and the pattern has a linear area which extends parallel to a bottom of the V-shaped light intensity distribution at a part corresponding to the bottom, and has an isolated area at a part distanced from the part corresponding to the bottom of the V-shaped light intensity distribution.

In the present invention, a combined light intensity distribution obtained from a light intensity gradient distribution formed through the first element and a light intensity minimum distribution with an inverse peak shape formed through the second element is formed on a surface of a substrate. As a result, a light intensity distribution with a desired gradient can be obtained, thereby performing crystallization with a large grain size. Further, according to the present invention, a crystal nucleus formation position, i.e., a crystal growth start point can be approximated to a position where the light intensity is minimum in the light intensity minimum distribution with the inverse peak shape as much as possible, and the sufficient crystal growth in the lateral direction from a crystal nucleus can be realized along a gradient direction of the light intensity in the light intensity gradient distribution, thereby crystallizing a non-crystal semiconductor film with a large grain size.

Furthermore, in the present invention, as different from the proximity method, since the image formation optical system is interposed between the first element or the second element and the substrate and a relatively large gap is assured between the substrate and the image formation optical system, the first element and the second element are not affected by ablation in the substrate, thus realizing the excellent crystallization. Moreover, since a relatively large gap is assured between the substrate and the image formation optical system, the substrate and the image formation optical system do not have to be separated from each other even when processing moves to another processing area on the substrate, thereby realizing processing with a high throughput. Additionally, since the relatively large gap is assured between the substrate and the image formation optical system, a detection light beam for position detection can be easily led into a light path between these members, and adjustment of a positional relationship between the substrate and the image formation optical system can be facilitated.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIGS. 5A and 5B are views showing a relationship between a pupil function and a point spread function in an image formation optical system;

FIGS. 6A and 6B are views schematically showing an entire structure of the first phase modulation element in the first embodiment;

FIGS. 10A and 10B are views schematically showing an entire structure of a first phase modulation element according to a first modification of the first embodiment;

FIG. 13 is a view schematically showing an entire structure of a third phase modulation element according to a first modification of the second embodiment;

FIGS. 15A to 15D are views schematically showing an impact of defocusing on a light intensity minimum distribution with an inverse peak shape formed on the substrate through the second phase modulation element according to the first modification of the first embodiment;

FIGS. 16A to 16D are views schematically showing an impact of a pupil function of the image formation optical system on a light intensity minimum distribution with an inverse peak shape formed on the substrate through the second phase modulation element according to the first modification of the first embodiment;

DETAILED DESCRIPTION OF THE INVENTION

Embodiments according to the present invention will now be described with reference to the accompanying drawings.

Figure 1:
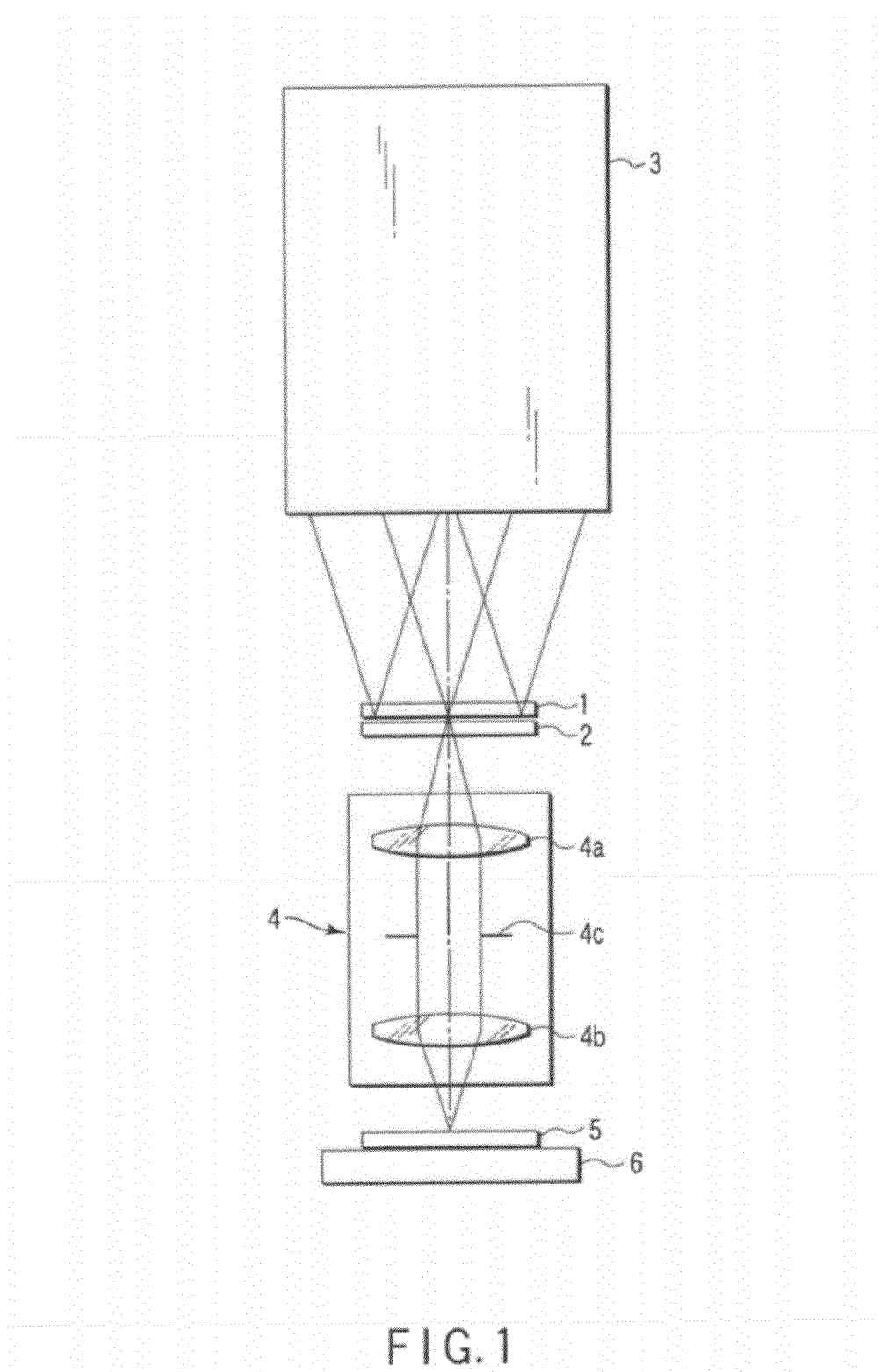
FIG. 1 is a view schematically showing a structure of a crystallization apparatus according to a first embodiment of the present invention.
Figure 2:
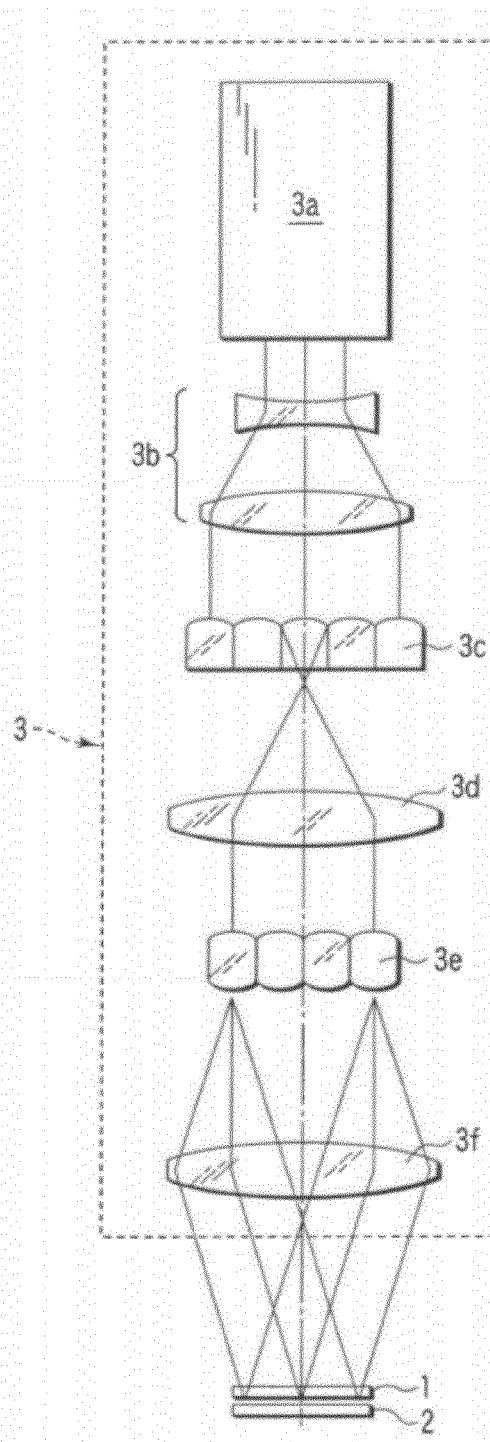
FIG. 2 is a view schematically showing an internal structure of an illumination system depicted in FIG. 1.

FIG. 1 is a view schematically showing a structure of a crystallization apparatus according to a first embodiment of the present invention. Further, FIG. 2 is a view schematically showing an internal structure of an illumination system of FIG. 1. A description will be given with reference to FIGS. 1 and 2. A crystallization apparatus according to the first embodiment comprises a first phase modulation element 1 which forms an optical pattern having a desired light intensity gradient distribution to incident light beam, and a second phase modulation element 2 having a pattern which forms a light intensity minimum distribution with an inverse peak shape. Structures of the first phase modulation element 1 and the second phase modulation element 2 will be described later.

It is to be noted that the first phase modulation element 1 and the second phase modulation element 2 are adjacently arranged in such a manner that their patterns are opposed to each other. Further, the crystallization apparatus according to the first embodiment comprises an illumination system 3 which illuminates the first phase modulation element 1 and the second phase modulation element 2 with their optical axes being coaxially arranged. The illumination system is, e.g., an optical system depicted in FIG. 2, and comprises a KrF excimer laser beam source 3a which supplies a light beam having a wavelength of 248 nm. It is to be noted that any other appropriate beam source such as an XeCl excimer laser beam source or a YAG laser beam source can be used as the beam source 3a. A laser beam supplied from the beam source 3a is expanded through a beam expander 3b, and then enter a first fly-eye lens 3c.

In this manner, a plurality of beam sources are formed on a rear focal plane of the first fly-eye lens 3c, and light fluxes from the plurality of beam sources illuminate an incident surface of a second fly-eye lens 3e through a first condenser optical system 3d in an overlapping manner. As a result, more beam sources are formed on a rear focal plane of the second fly-eye lens 3e than those on the rear focal plane of the first fly-eye lens 3c. Light fluxes from the plurality of beam sources formed on the rear focal plane of the second fly-eye lens 3e illuminate the first phase modulation element 1 and the second phase modulation element 2 through a second condenser optical system 3f.

Here, the first fly-eye lens 3c and the first condenser optical system 3d constitute a first homogenizer, and a laser beam supplied from the beam source 3a is homogenized by this first homogenizer in connection with an incident angle on the first phase modulation element 1 and the second phase modulation element 2. Furthermore, the second fly-eye lens 3e and the second condenser optical system 3f constitute a second homogenizer, and the laser beam whose incident angle is homogenized and supplied by the first homogenizer is further homogenized by this second homogenizer in relation to a light intensity at each in-plane position on the first phase modulation element 1 and the second phase modulation element 2. In this manner, the illumination system 3 applies the laser beam having a substantially homogenous light intensity distribution to the first phase modulation element 1 and the second phase modulation element 2. In other words, the illumination system 3 illuminates the first phase modulation element 1, and transmitted light beam which was transmitted through this first phase modulation element 1 enter the second phase modulation element 2.

The laser beam subjected to phase modulation in the first phase modulation element 1 and the second phase modulation element 2 irradiates on a substrate 5 through an image formation optical system 4. Here, the image formation optical system 4 arranges an intermediate surface between a pattern surface of the first phase modulation element 1 and a pattern surface of the second phase modulation element 2 and the substrate 5 in an optically conjugate relationship. In other words, the substrate 5 is set to a surface (image surface of the image formation optical system 4) which is optically conjugate with the intermediate surface. The image formation optical system 4 comprises an aperture diaphragm 4c between a positive lens group 4a and a positive lens group 4b.

The aperture diaphragm 4c has a plurality of aperture diaphragms having aperture portions (light transmission portions) which are different from each other in size, and the plurality of aperture diaphragms 4c may be replaceable with respect to a light path. Alternatively, the aperture diaphragm 4c may have an iris diaphragm which can continuously change a size of the aperture portion. In any case, a size of the aperture portion of the aperture diaphragm 4c (or an image side numerical aperture NA of the image formation optical system 4) is set so that a necessary light intensity distribution can be generated on a semiconductor film of the substrate 5 as will be described later.

It is to be noted that the image formation optical system 4 may be a refraction type optical system, a reflection type optical system or a reflection/reflection type optical system. Moreover, the substrate 5 is obtained by sequentially forming an underlying film and an amorphous silicon film on, e.g., a liquid crystal display glass sheet by a chemical vapor deposition method (CVD). The underlying film is an insulating film, e.g., $SiO_2$, prevents outside contaminations such as Na from being contaminated with amorphous silicon when the amorphous silicon directly comes into contact with the glass substrate, and also prevents a melting temperature of the amorphous silicon from being directly transferred to the glass substrate. The substrate 5 is positioned and held at a predetermined position on a substrate stage 6 by a vacuum chuck, an electrostatic chuck or the like.

FIGS. 3A to 3F are views illustrating a basic principle of the first phase modulation element. In FIGS. 3A to 3F, like reference numerals denote parts equal to those in FIGS. 1 and 2, thereby eliminating the tautological explanation. Generally, a light amplitude distribution U(x, y) of image formation by the first phase modulation element 1 is represented by the following Expression (1). It is to be noted that, in Expression (1), T(x, y) means a complex amplitude transmittance distribution of the first phase modulation element 1, * means a convolution (convolution integral), and ASF(x, y) means a point spread function of the image formation optical system 4. Here, the point spread function is defined as an amplitude distribution of a point image obtained by the image formation optical system.

$$U(x,y)=T(x,y)*ASF(x,y) \quad (1)$$

It is to be noted that the complex amplitude transmittance distribution T of the first phase modulation element 1 has an even amplitude, and hence it can be represented by the following Expression (2). It is to be noted that T0 is a fixed value and $\phi(x, y)$ indicates a phase distribution in Expression (2).

$$T=T0e^{i\phi(x,y)} \quad (2)$$

Additionally, if the image formation optical system 4 has a homogeneous circular pupil and no aberration, a relationship represented by the following Expression (3) can be achieved in connection with the point spread function ASF(x, y). It is to be noted that, in Expression (3), J1 indicates a Bessel function, $\lambda$ indicates a wavelength of a light beam, and NA indicates an image side numerical aperture of the image formation optical system 4 as described above.

$$ASF(x,y) \propto 2J_1(2\pi/\lambda \cdot NA \cdot r)/(2\pi/\lambda \cdot NA \cdot r) \quad (3)$$

where $r=(x^2+y^2)^{1/2}$

Figure 3A:
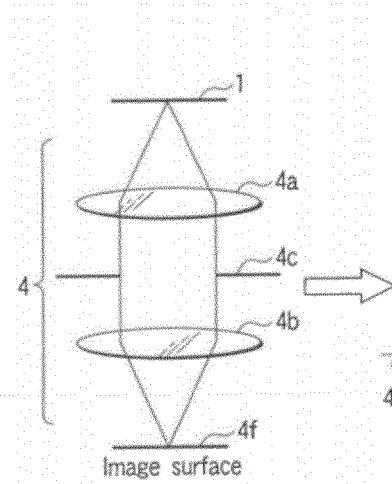
FIGS. 3A to 3F are views illustrating a basic principle of a first phase modulation element.
Figure 3B:
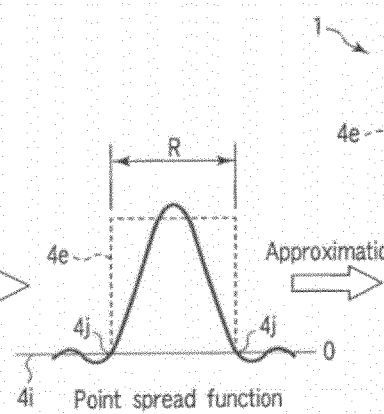
Figure 3C:
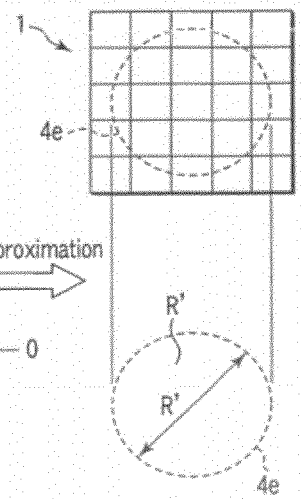

The point spread function of the image formation optical system 4 depicted in FIG. 3A is shown in FIG. 3B. When it is approximated in a cylindrical shape 4e having a diameter R (indicated by a broken line in FIG. 3B), a value obtained by integrating a complex amplitude distribution in a circle having a diameter R' (value determined by R=M×R' assuming that M is a magnification of the image formation optical system) on the first phase modulation element 1 shown in FIG. 3C determines a complex amplitude on the image surface 4f. As described above, a light amplitude of an image formed on the image surface 4f, i.e., a light intensity is given by a convolution of the complex amplitude transmittance distribution of the first phase modulation element 1 and the point spread function. Giving a consideration with the point spread function being approximated in the cylindrical shape 4e, a result obtained by integrating the complex amplitude transmittance of the phase modulation element 1 with an even weight in a circular point spread distribution range R depicted in FIG. 3C becomes a complex amplitude on the image surface 4f in FIG. 3A, and a square of its absolute value becomes a light intensity. It is to be noted that the point spread distribution range R in the image formation optical system 4 means a range within an intersection 4j with zero point 4i of a curved line in FIG. 3B which is drawn by the point spread function.

Figure 3E:
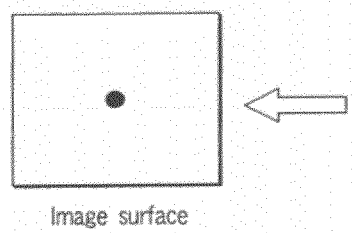
Figure 3D:
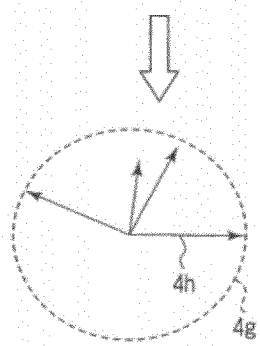
Figure 3F:
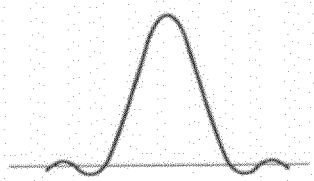

Therefore, the light intensity is increased as a change in phase in the point spread distribution range R is small and, conversely, the light intensity is reduced as a change in phase is large. This point can be readily understood in terms of a sum of phase vectors 4h in a unit circle 4g as shown in FIG. 3D. Assuming that the image surface 4f is, e.g., a semiconductor film, the point spread function in FIG. 3B becomes such a point spread function as shown in FIG. 3F. FIG. 3E is a view showing a point in the image surface 4f, and the light intensity at this point is determined by the above-described process.

Figures 4A, 4B, 4C:
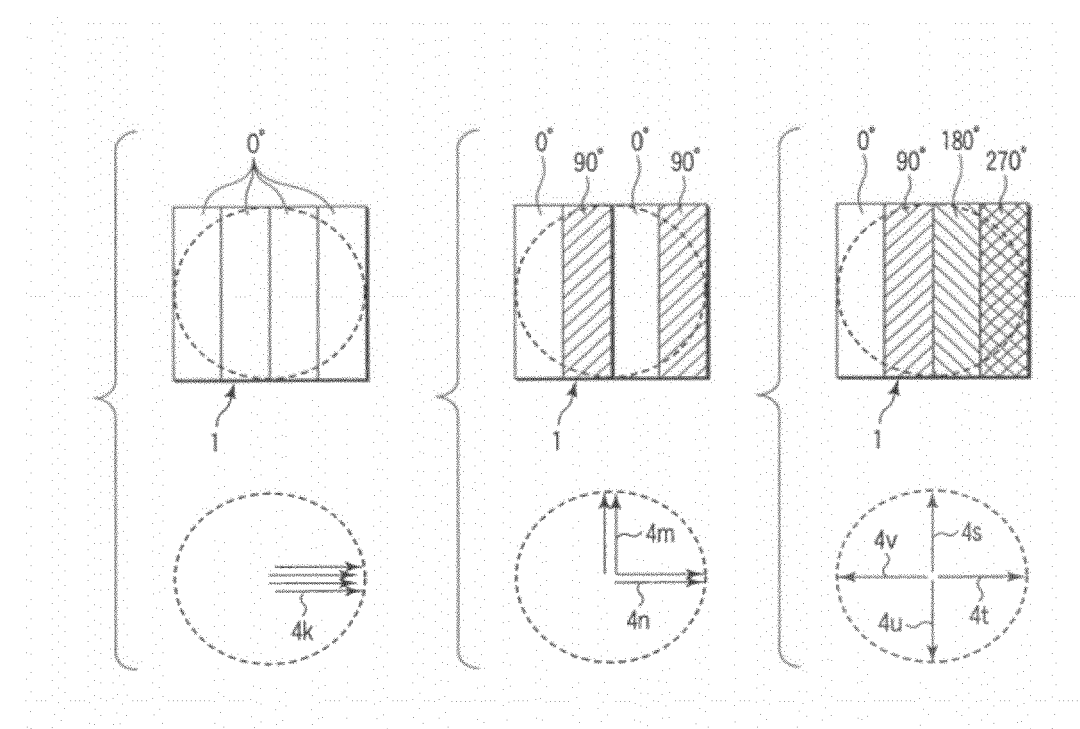
FIGS. 4A to 4C are views each showing a typical relationship between a change in phase in a point spread distribution range and a light intensity.

FIGS. 4A to 4C are views showing a typical relationship between a change in phase in the point spread distribution range R and a light intensity. The hatching of FIGS. 4B and 4C is provided in order to clarify portions having different phase values.

FIG. 4A is a view showing a case in which all of phase values of four areas obtained by dividing a surface of the phase modulation element 1 into four correspond to 0 degrees, a sum of four phase vectors 4k in a direction of 0 degrees corresponds to an amplitude 4E, and its square corresponds to a light intensity 16I. Here, E is a value indicative of a radius of a circle of a dotted line in a lower view of FIG. 4A, and I is determined as $E^2$=I.

FIG. 4B is a view showing a case in which phase values of two areas separated from each other in the four areas are 0 degrees and phase values of the other separated two areas are 90 degrees, a sum of two phase vectors 4m in a direction of 0 degrees and two phase vectors 4n in a direction of 90 degrees becomes an amplitude, its value corresponds to a square root of $8E^2$ (because $4E^2+4E^2=8E^2$), and its light intensity corresponds to 8I which is a square of the amplitude. FIG. 4C is a view showing the phase modulation elements 1 and 2 in case of an area having a phase value of 0 degrees, an area having a phase value of 90 degrees, an area having a phase value of 180 degrees and an area having a phase value of 270 degrees, a sum of a phase vector 4s in a direction of 0 degrees, a phase vector 4t in a direction of 90 degrees, a phase vector 4u in a direction of 180 degrees and a phase vector 4v in a direction of 270 degrees corresponds to an amplitude 0E, and its square corresponds to a light intensity 0I.

FIGS. 5A and 5B are views showing a relationship between a pupil function and a point spread function in the image formation optical system 4. In general, the point spread function is given by Fourier transformation of the pupil function. Specifically, if the image formation optical system 4 has a homogeneous circular pupil and no aberration, the point spread function ASF(x, y) is represented by Expression (3). However, if an aberration exists in the image formation optical system 4 or the image formation optical system 4 has a pupil function other than that of the homogeneous circular pupil, the point spread function is not restricted to the above-described expression. If the image formation optical system 4 has the homogeneous circular pupil and no aberration, it is known that a radius R/2 of a central area (i.e., an airy disk) until the point spread function becomes 0 for the first time as shown in FIG. 5B is represented by the following Expression (4).

$$R/2=0.61\lambda/NA \quad (4)$$

In this specification, the point spread distribution range R means a circular central area until the point spread function ASF(x, 0) becomes 0 for the first time as shown in FIGS. 3B and 5B. As apparent from FIGS. 4A to 4C, if a plurality of (four in FIGS. 4A to 4C) phase modulation units are included in a circle optically corresponding to the point spread distribution range R of the image formation optical system, an amplitude of a light beam, namely, a light intensity can be analytically controlled based on a sum of the plurality of phase vectors (4k, 4m, 4n and 4s to 4v) in accordance with a simple calculation. As a result, a light intensity distribution required to perform crystallization with a large grain size, which is generally hard to be realized, can be relatively readily obtained.

Therefore, in the present invention, the phase modulation unit of the first phase modulation element 1 must be optically smaller than the radius R/2 of the point spread distribution range R of the image formation optical system 4 in order to freely control the light intensity. In other words, a magnitude of the phase modulation unit of the first phase modulation element 1 on the image side of the image formation optical system 4 must be smaller than the radius R/2 of the point spread distribution range R of the image formation optical system 4. A structure and effects of the first phase modulation element 1 in the first embodiment will now be described hereinafter.

Figure 6A:
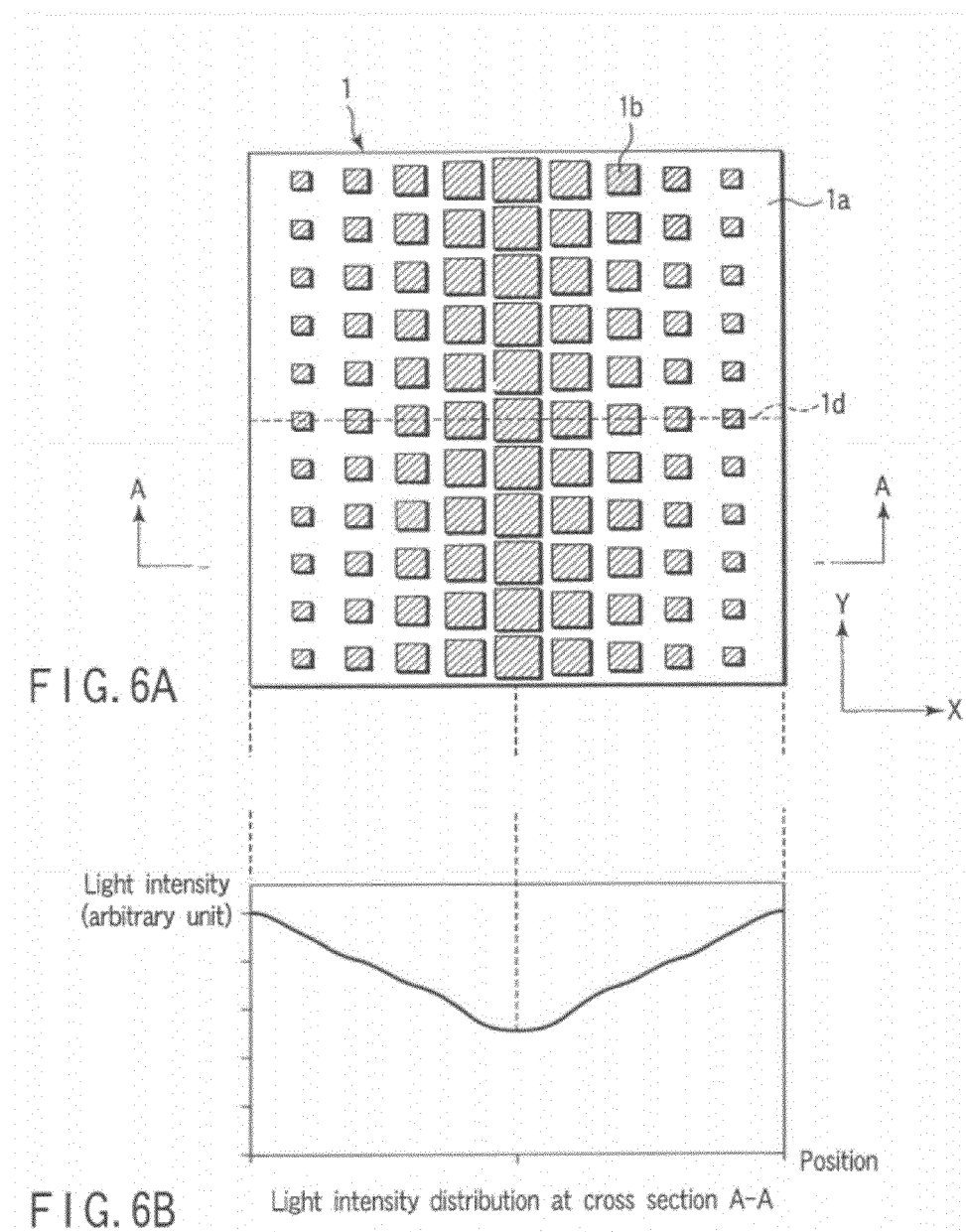
Figure 7A:
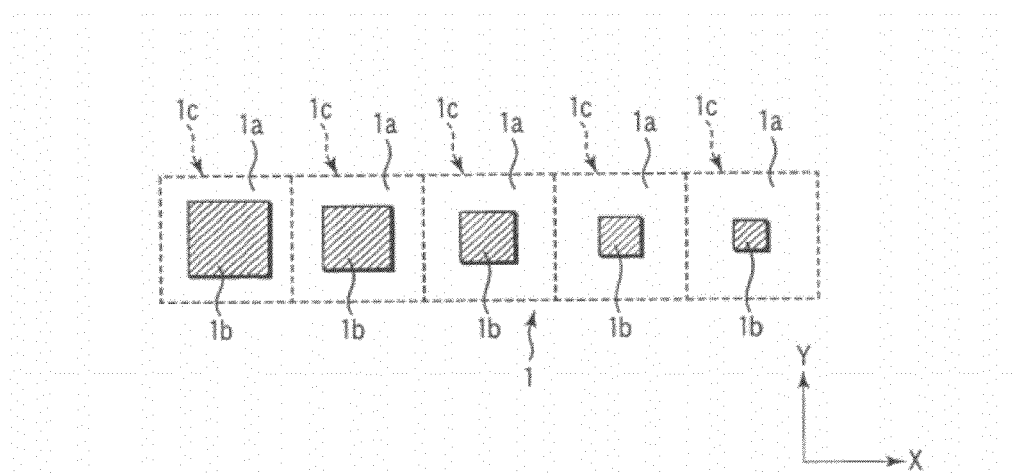
FIGS. 7A and 7B are views schematically showing a structure of a basic pattern in the first phase modulation element depicted in FIG. 6A.
Figure 7B:
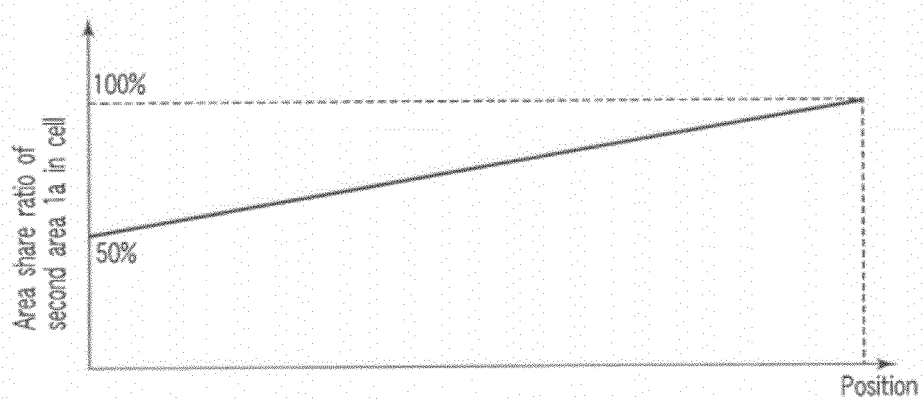

FIGS. 6A and 6B are views schematically showing an entire structure of the phase modulation element in the first embodiment. The hatching in FIGS. 6A and 7A is provide in order to clarify first areas 1b. Additionally, FIGS. 7A and 7B are views schematically showing a structure of a basic pattern in the first phase modulation element depicted in FIG. 6A. The pattern of the first phase modulation element 1 depicted in FIG. 6A includes a basic pattern depicted in FIG. 7A. Referring to FIG. 7A, the basic pattern of the first phase modulation element 1 has a plurality of cells (indicated by rectangular shapes of a dotted line in the drawing) 1c whose size is optically smaller than the radius R/2 of the point spread distribution range R of the image formation optical system 4.

In each cell is are formed a first area (indicated by the hatching in the drawing) 1b having a phase value (first phase value) of, e.g., 90 degrees and a second area (indicated by a blank part in the drawing) 1a having a phase value of, e.g., 0 degrees. As shown in FIG. 7A, area share ratios of the first area 1b and the second area 1a in each cell 1c vary in accordance with each cell. In other words, there is a phase distribution in which area share ratios of the first area 1b having a phase value of 90 degrees and the second area 1a having a phase value of 0 degrees vary depending on each position in an X direction. Further, specifically, an area share ratio of the second area 1a in the cell is closest to 50% in a cell on the left-hand side in the drawing, it is closest to 100% in a cell on the right-hand side in the drawing, and this ratio monotonously varies between these cells in the X direction.

As described above, the first phase modulation element 1 has the phase distribution based on the phase modulation unit (cell) 1c whose size is optically smaller than the radius R/2 of the point spread distribution range R of the image formation optical system 4. Therefore, a light intensity distribution formed on the substrate 5 can be analytically controlled in accordance with the simple calculation by appropriately changing the area share ratios of the first area 1b and the second area 1a in each phase modulation unit 1c, i.e., a sum of the two phase vectors.

Specifically, as shown in FIG. 6B, there can be obtained a V-shaped light intensity gradient distribution having a gradient in a one-dimensional direction (having a gradient in the X direction) along which the light intensity is maximum at both side positions where the area share ratio of the second area 1a is closest to 100% and the light intensity is minimum at a central position where the area share ratio of the second area 1a is closest to 50%. Here, the V shape does mean a complete V shape, and it conceptually includes, e.g., a trough-like shape which is substantially close to the V shape as shown in FIG. 6B and a trough-like shape partially having a U-shaped portion. Furthermore, the V shape is not restricted to one shape, and partially including this V shape can suffice. For example, the number of the phase modulation elements 1 shown in FIG. 6A does not have to be one, and the plurality of phase modulation elements 1 may be aligned and have a light intensity distribution with a shape in which a plurality of V shapes are aligned in accordance with this alignment. The first phase modulation 1 can be manufactured by forming a thickness distribution corresponding to necessary phase steps on, e.g., a quartz glass substrate. A change in thickness of the quartz glass substrate can be formed by selective etching or FIB (Focused Ion Beam) processing.

Figure 8A:
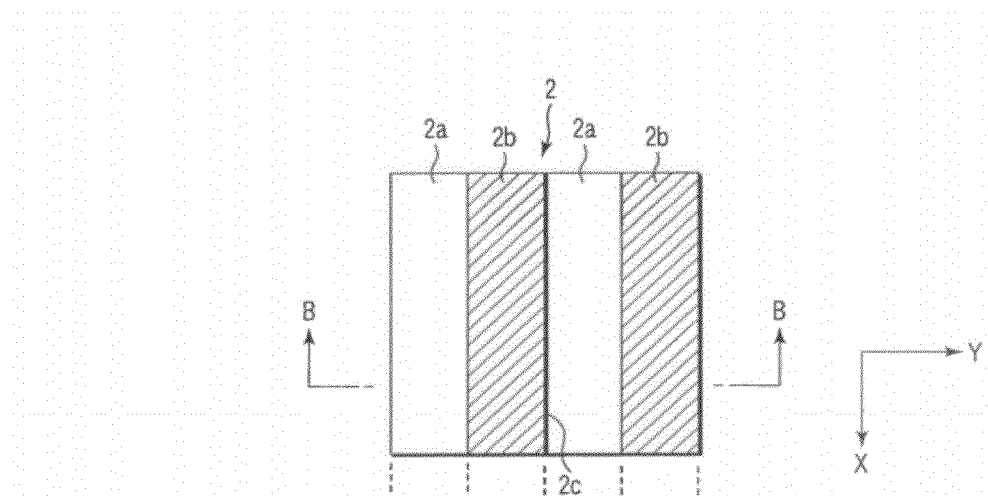
FIGS. 8A and 8B are views schematically showing a structure in a second phase modulation element in the first embodiment.
Figure 8B:
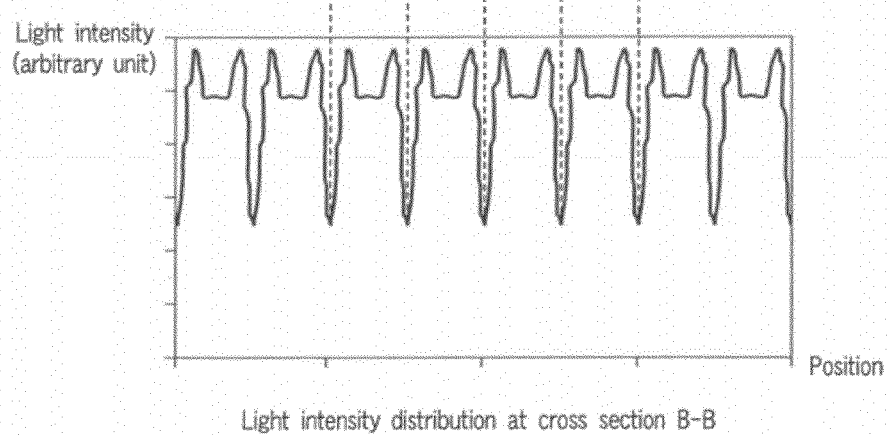

FIGS. 8A and 8B are views schematically showing a structure of the second phase modulation element in the first embodiment. Referring to FIG. 8A, a pattern of the second phase modulation element 2 has a plurality of (only four are shown) strip-like areas extending in a perpendicular direction in the drawing, and strip-like areas adjacent to each other have phase values different from each other. Specifically, the second phase modulation element 2 is a phase shifter having a line-and-space pattern whose phase different is 90 degrees, and has a pattern in which a rectangular first strip-like area 2a having a phase value of 0 degree and a rectangular second strip-like area 2b having a phase values of 90 degrees are alternately formed. The hatching in FIG. 8A is provided in order to clarify the part of the second strip-like areas 2b.

In this case, as shown in FIG. 8B, there can be obtained a light intensity minimum distribution with an inverse peak shape in which the light intensity is minimum on a phase shift line as a boundary between the first strip-like area 2a and the second strip-like area 2b and the light intensity is suddenly increased toward the periphery (on both sides along the Y direction as a pitch direction). The second phase modulation element 2 can be manufactured by forming a thickness distribution corresponding to necessary phase steps on, e.g., a quartz glass substrate like the first phase modulation element 1. A change in thickness of the quartz glass substrate can be formed by selective etching or FIB.

In the first embodiment, a direction along which area share ratios of the first area 1b and the second area 1a in the first phase modulation element 1 vary (direction indicated by a broken line 1d in FIG. 6A) matches with a direction of the phase shift line in the second phase modulation element 2 (direction indicated by a solid line 2c in FIG. 8A). In other words, the pattern of the second phase modulation element 2 has the plurality of strip-like areas extending along a gradient direction (X direction) of the light intensity in the light intensity gradient distribution formed through the first phase modulation element 1.

Figure 9A:
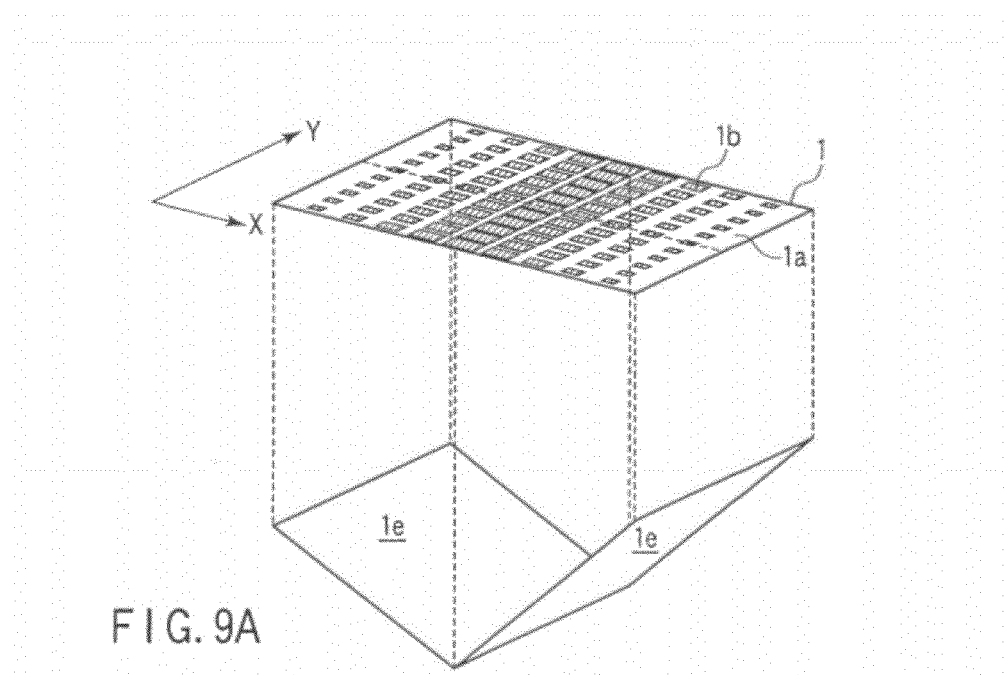
FIG. 9A is a perspective view schematically showing a conformation of a V-shaped light intensity distribution formed through the first phase modulation element.
Figure 9B:
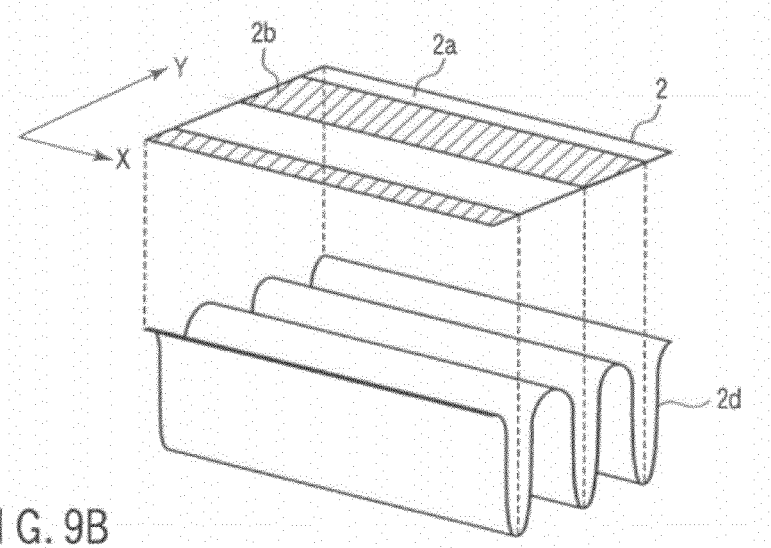
FIG. 9B is a perspective view schematically showing a conformation of a light intensity minimum distribution with an inverse peak shape formed through the second phase modulation element.
Figure 9C:
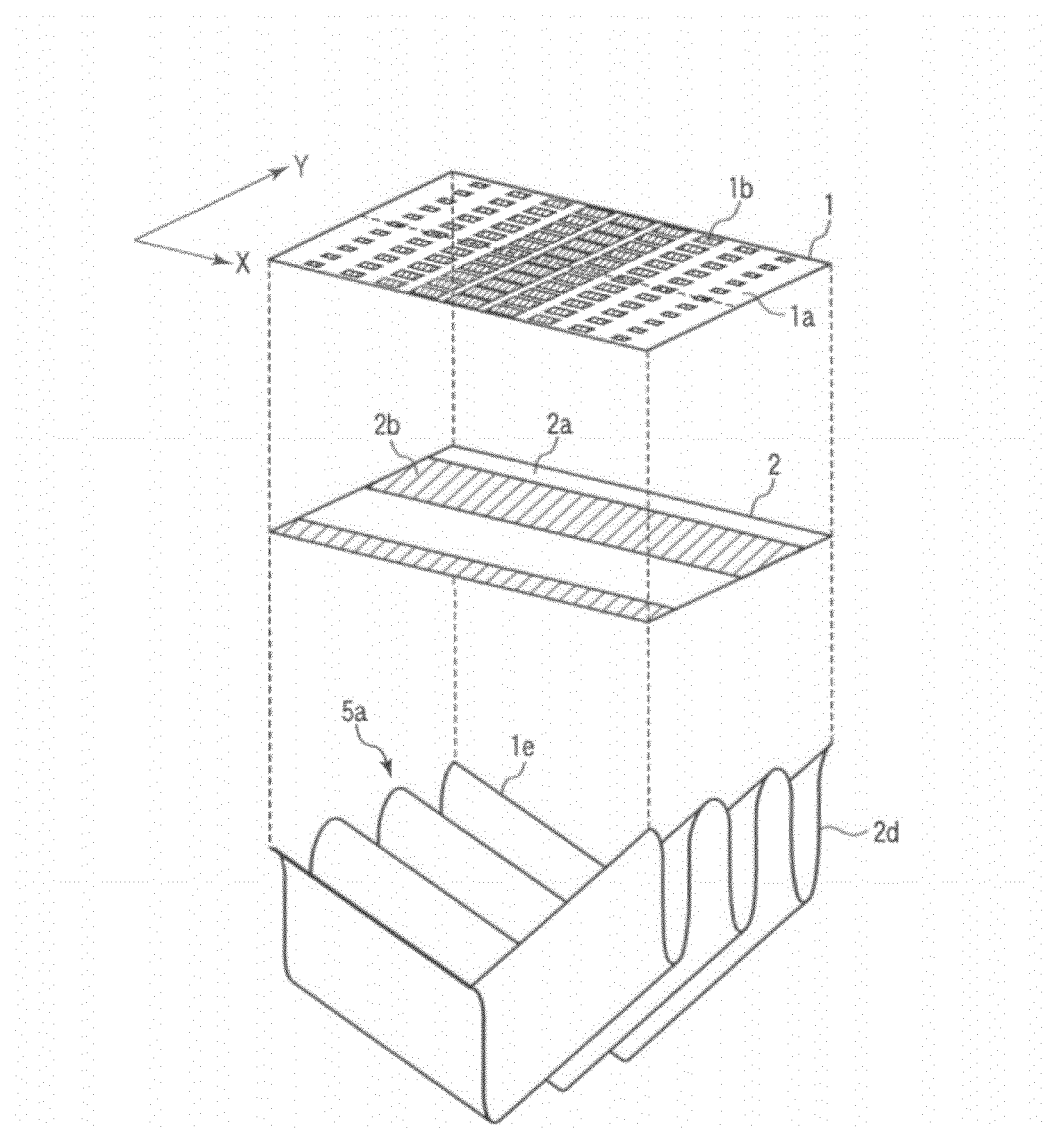
FIGS. 9C and 9D are perspective views schematically showing a conformation of a combined light intensity distribution obtained from the V-shaped light intensity gradient distribution formed through the first phase modulation element and the light intensity minimum distribution with the inverse peak shape formed through the second phase modulation element.

As a result, as the first embodiment, FIG. 9A shows a perspective view of a V-shaped light intensity gradient distribution 1e formed through the first phase modulation element 1, and FIG. 9B shows a perspective view of a light intensity minimum distribution 2d with an inverse peak shape formed through the second phase modulation element 2. The hatching of FIGS. 9A, 9B and 9C is provided in order to clarify the portions of the first area 1b and the second strip-like area 2b. The second phase modulation element 2 depicted in FIG. 9B has the first strip-like areas 2a and the second strip-like areas 2b configured therein in such a manner three inverse peaks of the light intensity minimum distribution are included. Therefore, as compared with the second phase modulation element 2 forming five inverse peaks as shown in FIG. 8A, a width of each of the first strip-like area 2a and the second strip-like area 2b is reduced to ½ in the second phase modulation element 2 depicted in FIGS. 9B and 9C.

FIG. 9C shows a combined light intensity distribution obtained from the V-shaped light intensity gradient distribution 1e formed through the first phase modulation element 1 and the light intensity minimum distribution 2d with the inverse peak shape formed through the second phase modulation element 2.

Figure 9D:
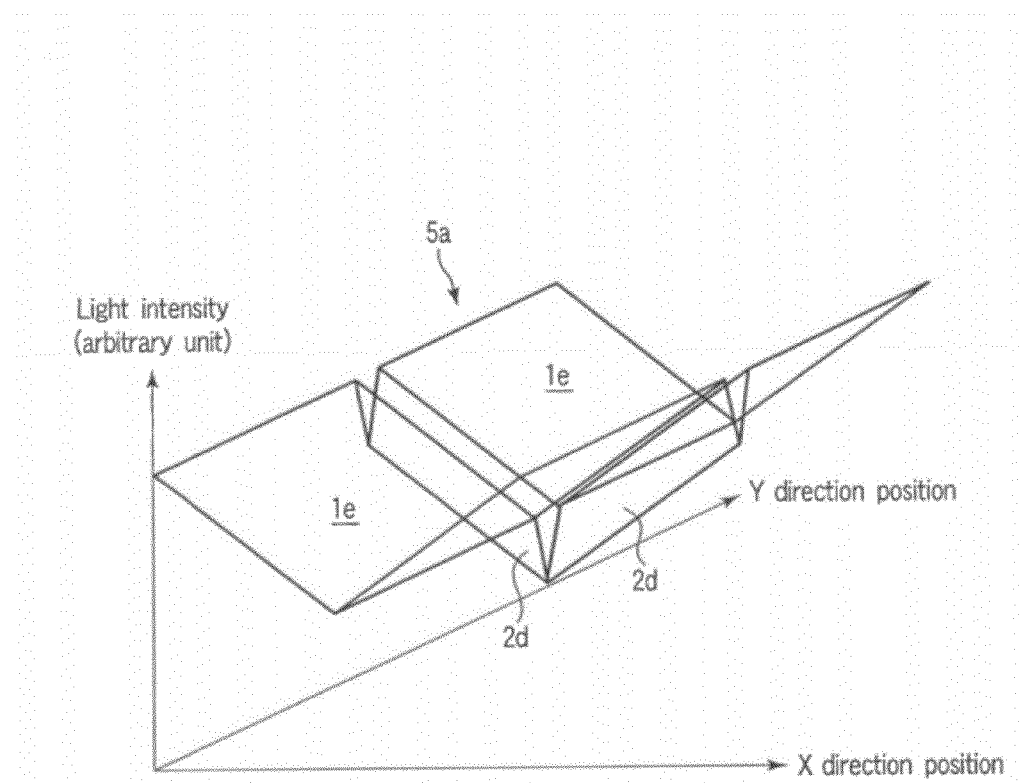

For a better understanding, FIG. 9D is a perspective view of a combined light intensity distribution when the number of the inverse peak in the light intensity minimum distribution formed through the second phase modulation element 2 is one. That is, a combined light intensity distribution 5a having a V-shaped pattern and one inverse peak pattern is formed on the surface of the substrate 5. In the light intensity distribution 5a having the V-shaped pattern and one inverse peak pattern, a crystal nucleus formation position, i.e., a crystal growth start point can be approximated as much as possible to a position where the light intensity is minimum in the light intensity minimum distribution 2d having the inverse peak shape, and the sufficient crystal growth in the lateral direction from a crystal nucleus can be realized along the gradient direction (X direction) of the light intensity in the V-shaped light intensity gradient distribution 1e, thereby crystallizing a non-crystal semiconductor film with a large grain size.

Moreover, in the first embodiment, as different from the proximity method, since the image formation optical system 4 is interposed between the second phase modulation element 2 and the substrate 5 and a relatively large gap is assured between the substrate and the image formation optical system 4, products due to ablation from the substrate 5 do not adhere to the first phase modulation element 1 and the second phase modulation element 2 or the image formation optical system 4, and the excellent crystallization can be realized. Additionally, in the first embodiment, as different from the proximity method, since the relatively large gap is assured between the substrate 5 and the image formation optical system 4, the substrate 5 and the image formation optical system 4 do not have to be separated from each other when processing moves to another processing area on the substrate 5, and processing with a high throughput can be realized.

Further, in the first embodiment, as different from the proximity method, since the relatively large gap is assured between the substrate 5 and the image formation optical system 4, a detection light beam for position detection can be led into a light path between these members, and a positional relationship between the substrate 5 and the image formation optical system 4 can be readily adjusted. As described above, in the crystallization apparatus and the crystallization method according to the first embodiment, the sufficient crystal growth in the lateral direction from a crystal nucleus can be realized while avoiding an impact of ablation in a semiconductor film, and a crystallized semiconductor film with a large grain size can be generated.

Figure 10A:
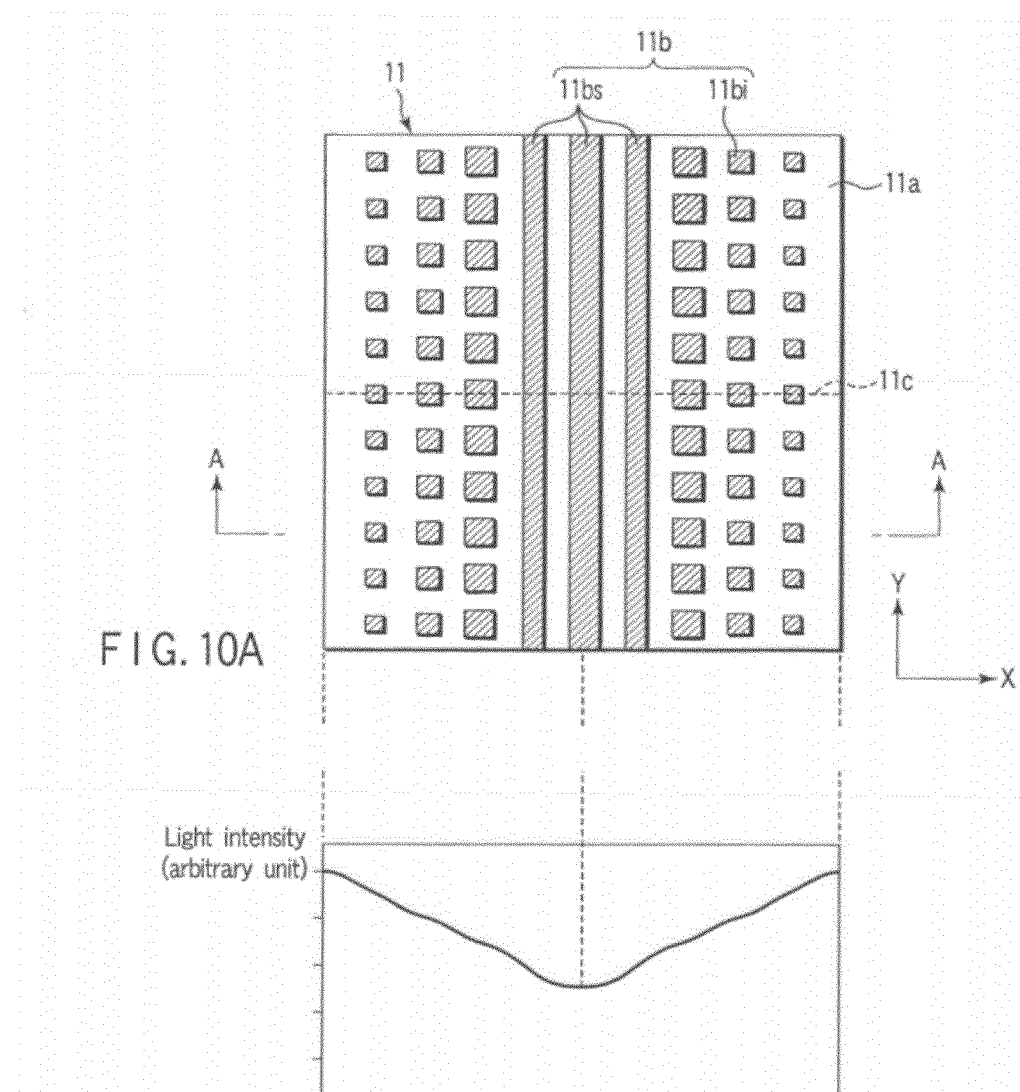

FIGS. 10A and 10B are views schematically showing an entire structure of a first phase modulation element according to a first modification of the first embodiment. The hatching in FIG. 10A is provided in order to clarify first areas 11$b$. The first phase modulation element 11 according to the first modification has a structure which is similar to the first phase modulation element 1 of the first embodiment. However, all the first areas 1$a$ having a phase value of 90 degrees have an isolated area conformation and they are discretely arranged all over in the first phase modulation element 1 according to the first embodiment, but the first phase modulation element 11 according to the first modification is different from the first embodiment in that the first areas 11$b$ having a phase value of 90 degrees have a mixed conformation of a linear area and an isolated area.

Specifically, as shown in FIG. 10A, a pattern of the first phase modulation element 11 according to the first modification has three linear areas 11$bs$ extending parallel (in the Y direction) to a bottom of the V-shaped light intensity gradient distribution at a part corresponding to the bottom, and any other part, i.e., a part distanced from the bottom of the V-shaped light intensity gradient distribution has many isolated areas 11$bi$. Here, a width (dimension in the X direction) of the linear area 11$bs$ is set in such a manner that area share ratios of the first area 11$b$ and the second area 11$a$ correspond to area share ratios of the first area 1$b$ and the second area 1$a$ in the first phase modulation element 1 according to the first embodiment.

By using the first phase modulation element 11 according to the first modification in this manner, such a V-shaped light intensity gradient distribution one-dimensionally having a gradient (having a gradient in the X direction in FIG. 10B) as shown in FIG. 10B can be obtained like the example of the first phase modulation element 1 according to the first embodiment. Furthermore, in the first phase modulation element 11, such a light intensity distribution 5$a$ having a V-shaped pattern and an inverse peak shape pattern as shown in FIGS. 9C and 9D can be formed on the surface of the substrate 5 by matching a direction along which the area share ratios of the first area 11$b$ and the second area 11$a$ vary (direction indicated by a broken line 11$c$ in FIG. 10A) with a direction of the phase shift line in the second phase modulation element 2 (direction indicated by a solid line 2$c$ in FIG. 8A).

Since the first phase modulation element 1 according to the first embodiment has the isolated areas 1$b$ which are discretely arranged in the Y direction at the part corresponding to the bottom of the V-shaped light intensity gradient distribution, completely even optical characteristics cannot be obtained along the bottom of the V-shaped light intensity gradient distribution. Although the optical characteristics can be approximated to the even state by increasing a division number of the isolated areas, obtaining the completely even state is impossible. As a result, in the first phase modulation element 1 according to the first embodiment, irregularities are readily generated in optical characteristics of a combined light intensity distribution which is obtained when the direction along which the area share ratios of the first area 1$b$ and the second area 1$a$ vary (direction indicated by a broken line 1$d$ in FIG. 6A) and the direction of the phase shift line in the second phase modulation element 2 (direction indicated by the solid line 2$c$ in FIG. 8A) are displaced in the Y direction.

Conversely, in the first phase modulation element 11 according to the first modification, since the linear areas 11$bs$ which extend in the Y direction are provided at the part corresponding to the bottom of the V-shaped light intensity gradient distribution, the completely even optical characteristics can be obtained along the bottom of the V-shaped light intensity gradient distribution. As a result, in the first phase modulation element 11 according to the first modification, even if the direction along which the area share ratios of the first area 11$b$ and the second area 11$a$ vary (direction indicated by the broken line 11$c$ in FIG. 10A) and the direction of the phase shift line in the second phase modulation element 2 (direction indicated by the solid line 2$c$ in FIG. 8A) are displaced in the Y direction, the optical characteristics of the obtained combined light intensity distribution are advantageously hard to fluctuate.

Figure 11:
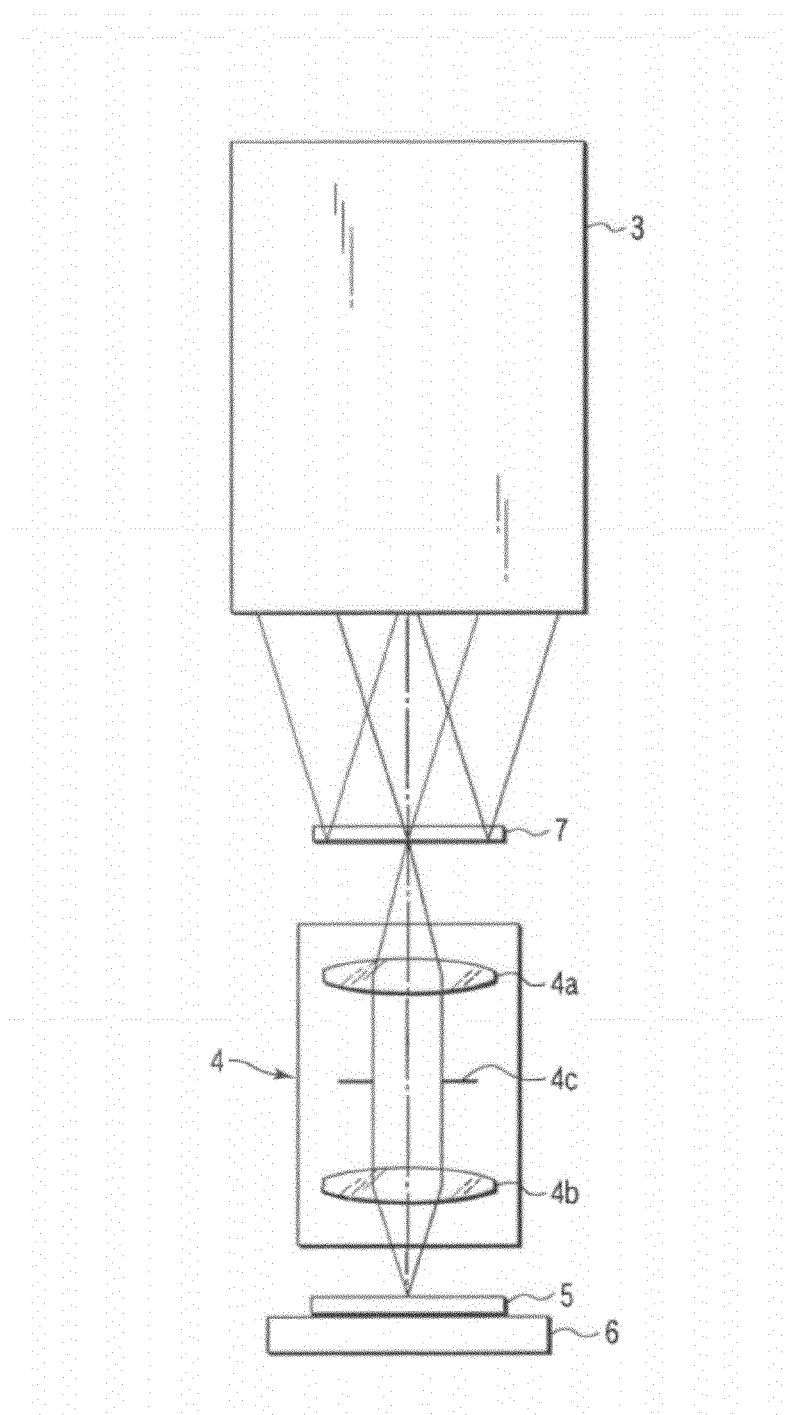
FIG. 11 is a view schematically showing a structure of a crystallization apparatus according to a second embodiment of the present invention.
Figure 12A:
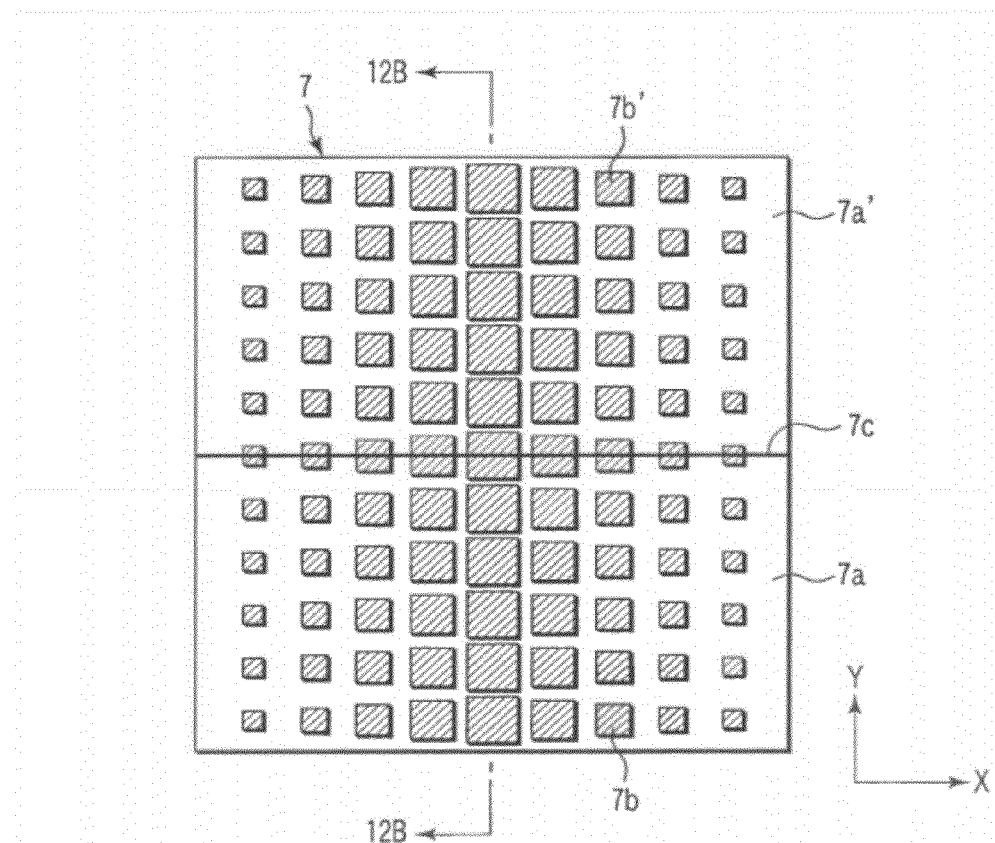
FIG. 12A is a view schematically showing an entire structure of a third phase modulation element in the second embodiment.
Figure 12B:
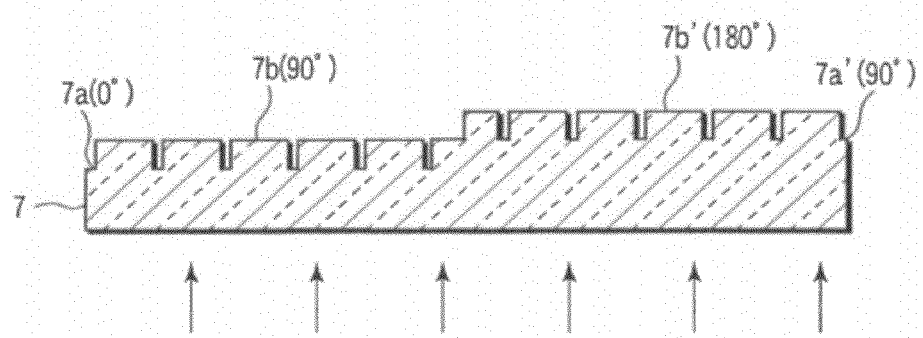
FIG. 12B is a view schematically showing a cross-sectional view of the third phase modulation element in the second embodiment.

FIG. 11 is a view schematically showing a structure of a crystallization apparatus according to a second embodiment of the present invention. FIG. 12A is a view schematically showing an entire structure of a third phase modulation element according to the second embodiment. The hatching in FIG. 12A is provided in order to clarify first areas 7$b$ and 7$b'$. FIG. 12B is a view showing a cross section of FIG. 12A. Arrows mean application of an incident light beam. The crystallization apparatus according to the second embodiment has a structure similar to the crystallization apparatus according to the first embodiment. However, the first embodiment includes the first phase modulation element 1 and the second phase modulation element 2, whereas the second embodiment comprises one third phase modulation element 7 in place of the first phase modulation element 1 and the second phase modulation element 2 as a difference from the first embodiment. Taking notice of a difference from the first embodiment, the second embodiment will be described hereinafter.

In the second embodiment, as shown in FIG. 11, one third phase modulation element 7 which has a combined pattern obtained from a pattern forming a light intensity gradient distribution and a pattern forming a light intensity minimum distribution with an inverse peak shape is provided in place of the first phase modulation element 1 and the second phase modulation element 2 according to the first embodiment. Here, a pattern surface of the third phase modulation element 7 is set to be opposed to the image formation optical system 4. Moreover, a phase modulation quantity of the combined pattern of the third phase modulation element 7 corresponds to a sum of a phase modulation quantity of the pattern for forming the light intensity gradient distribution in the first phase modulation element 1 according to the first embodiment and a phase modulation quantity of the pattern for forming the light intensity minimum distribution with the inverse peak shape in the second phase modulation element 2 according to the first embodiment.

Specifically, as shown in FIG. 12A, the third phase modulation element 7 is divided into a lower area and an upper area by a boundary 7$c$ along the X direction. In the lower area, first areas 7$b$ and second areas 7$a$ are provided in association with the first areas 1$b$ and the second areas 1$a$ in the pattern of the first phase modulation element 1 according to the first embodiment. Additionally, phase values of the first area 7$b$ and the second area 7$a$ are values obtained by adding 0 degrees which is a phase value of the first area 2$a$ of the second phase modulation element 2 according to the first embodiment to phase values of the first area 1$b$ and the second area 1$a$, respectively. That is, a phase value of the first area 7$b$ is 90 degrees in association with a phase value of the first area 1$b$, and a phase value of the second area 7$a$ is 0 degrees in association with a phase value of the second area 1a. Here, a phase angle whose phase is delayed is determined as positive.

On the other hand, in the upper area, first areas 7b' and second areas 7a' are provided in association with the first areas 1b and the second areas 1a in the pattern of the first phase modulation element 1 according to the first embodiment. Further, phase values of the first area 7b' and the second area 7a' are values obtained by adding 90 degrees which is a phase value of the second area 2b of the second phase modulation element 2 according to the first embodiment to phase values of the first area 1b and the second area 1a. That is, a phase value of the first area 7b' is 180 degrees which is larger than a phase value of the first area 1b by 90 degrees, and a phase value of the second area 7a' is 90 degrees which is larger than a phase value of the second area 1a by 90 degrees. FIG. 12B shows a cross-sectional view cutting across the upper area and the lower area. Each positional relationship between 7a (0 degrees), 7b (90 degrees), the boundary 7c, 7a' (90 degrees) and 7b' (180 degrees) can be clearly understood.

As described above, the phase modulation quantity of the combined pattern of the third phase modulation element 7 according to the second embodiment corresponds to a sum of the phase modulation quantity of the pattern for forming the light intensity gradient distribution in the first phase modulation element 1 according to the first embodiment and the phase modulation quantity of the pattern for forming the light intensity minimum distribution with the inverse peak shape in the second phase modulation element 2 according to the first embodiment. Therefore, in the second embodiment, such a light intensity distribution 5a having the V-shaped pattern and the inverse peak shape pattern as shown in FIGS. 9C and 9D can be formed on the surface of the substrate 5 by the effect of the third phase modulation element 7 like the first embodiment. Furthermore, as different from the first embodiment, the second embodiment has an advantage that positioning of the two phase modulation elements does not have to be carried out.

FIG. 13 is a view schematically showing an entire structure of a third phase modulation element according to a first modification of the second embodiment. The hatching of FIG. 13 is provided in order to clarify first areas 17b and 17b'. A phase modulation quantity of a combined pattern of the third phase modulation element 17 according to the first modification shown in FIG. 13 corresponds to a sum of a phase modulation quantity of the pattern for forming the light intensity gradient distribution in the first phase modulation element 11 according to the first modification of the first embodiment and a phase modulation quantity of the pattern for forming the light intensity minimum distribution with the inverse peak shape in the second phase modulation element 2 according to the first embodiment.

Specifically, as shown in FIG. 13, the third phase modulation element 17 is divided into a lower area and an upper area by a boundary 17c along the X direction.

In the lower area, first areas 17b (17bs, 17bi) and second areas 17a are provided in association with the first areas 11b (11bs, 11bi) and the second areas 11a in the pattern of the first phase modulation element 11 (FIG. 10A) according to the first modification of the first embodiment. Moreover, phase values of the first area 17b and the second area 17a are values obtained by adding 0 degree which is a phase value of the first area 2a of the second phase modulation element 2 according to the first embodiment to phase values of the first area 11b and the second area 11a, respectively. That is, a phase value of the first area 17b is 90 degrees in association with a phase value of the first area 11b, and a phase value of the second area 17a is 0 degrees in association with a phase value of the second area 11a.

On the other hand, in the upper area, first areas 17b (17'bs, 17bi') and second areas 17a' are provided in association with the first areas 11b (11bs, 11bi) and the second areas 11a in the pattern of the first phase modulation element 11 according to the first modification of the first embodiment. Additionally, phase values of the first area 17b' and the second area 17a' are values obtained by adding 90 degrees which is a phase value of the second area 2b of the second phase modulation element 2 according to the first embodiment to phase values of the first area 11b and the second area 11a, respectively. That is, a phase value of the first area 17b' is 180 degrees which is larger than a phase value of the first area 11b by 90 degrees, and a phase value of the second area 17a' is 90 degrees which is larger than a phase value of the second area 11a by 90 degrees.

As described above, the phase modulation quantity of the combined pattern of the third phase modulation element 17 according to the first modification corresponds to a sum of the phase modulation quantity of the pattern for forming the light intensity gradient distribution in the first phase modulation element 11 according to the first modification of the first embodiment and the phase modulation quantity of the pattern for forming the light intensity minimum distribution with the inverse peak shape in the second phase modulation element 2 according to the first embodiment. Therefore, in this modification, the light intensity distribution 5a having the V-shaped pattern and the inverse peak shape pattern can be formed on the surface of the substrate 5 like the second embodiment and, as different from the first embodiment, there is an advantage that positioning of the two phase modulation elements does not have to be performed.

Figure 14A:
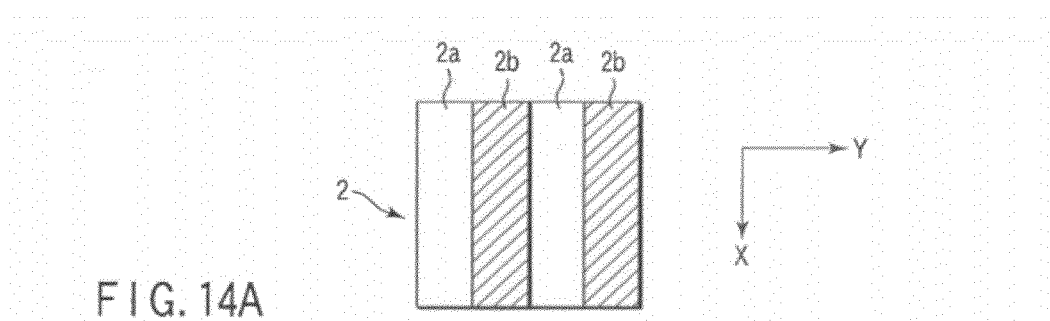
FIGS. 14A to 14D are views schematically showing an impact of defocusing on a light intensity minimum distribution with an inverse peak shape formed on a substrate through the second phase modulation element according to the first embodiment.
Figure 14B:
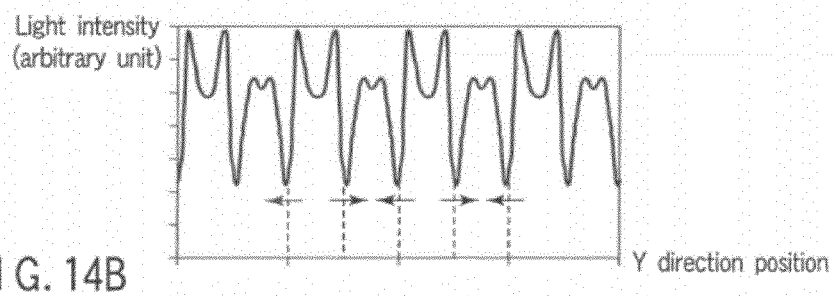
Figure 14C:
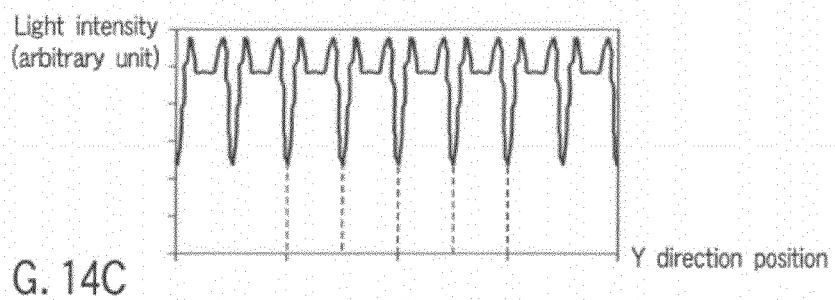

FIGS. 14A to 14D are views schematically showing an impact of defocusing on the light intensity minimum distribution with the inverse peak shape formed on the substrate through the second phase modulation element according to the first embodiment. The hatching of FIG. 14A is provided in order to clarify second strip-like areas 2b. When such a pattern surface of the second phase modulation element 2 as shown in FIG. 14A and the surface of the substrate 5 are set in an optically conjugate relationship through the image formation optical system 4, that is, when the surface of the substrate 5 is set at a focus position with respect to the pattern surface of the second phase modulation element 2, such a light intensity minimum distribution with an inverse peak shape as shown in FIG. 14C is formed on the surface of the substrate 5 through the second phase modulation element 2.

Figure 14D:
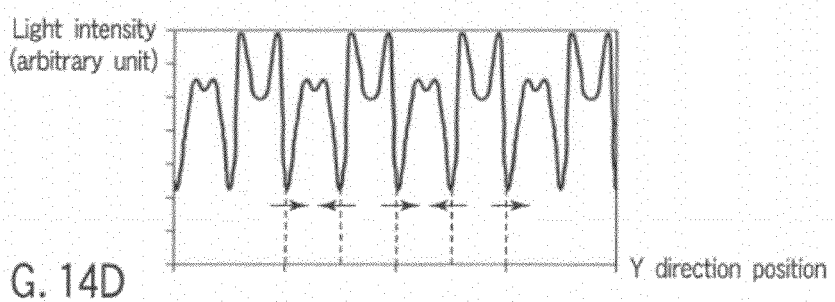

In this case, if the first strip-like areas 2a and the second strip-like areas 2b of the second phase modulation element 2 are arranged at equal pitches, peak points at which the light intensity is minimum in the light intensity minimum distribution with the inverse peak shape appear along the Y direction at equal intervals. However, if the surface of the substrate 5 is set at a defocus position deviating from the focus position with respect to the pattern surface of the second phase modulation element 2, the peak points are alternately shifted in opposite directions as shown in FIGS. 14B and 14D, and the intervals of the peak points become uneven, thereby collapsing the symmetry for each pitch.

As a result, intervals between central positions of generated crystal grains become uneven, and crystal grains having two types of different shapes are alternately aligned along the Y direction, which is disadvantageous. It is to be noted that a board thickness deviation which can be a factor of defocusing unavoidably exists in the substrate 5, and its cycle is approximately several cm. On the other hand, a dimension of a crystal grain is several μm which is far smaller than the cycle of the board thickness deviation. Therefore, in terms of a range of adjacent crystal grains, a defocus quantity can be considered as substantially even.

FIGS. 15A to 15D are views schematically showing an impact of defocusing on the light intensity minimum distribution with the inverse peak shape formed on the substrate through the second phase modulation element according to the first modification of the first embodiment. The hatching of FIG. 15A is provided in order to clarify portions having different phases. Referring to FIG. 15A, the second phase modulation element 12 according to the first modification has a pattern in which a rectangular first strip-like area 12a having a phase value of 0 degrees, a rectangular second strip-like area 12b having a phase value of 90 degrees, a rectangular third strip-like area 12c having a phase value of 180 degrees and a rectangular fourth strip-like area 12d having a phase value of 270 degrees are repeated along one direction (Y direction).

In the first modification, when the surface of the substrate 5 is set at a focus position with respect to the pattern surface of the second phase modulation element 12, such a light intensity minimum distribution with an inverse peak shape as shown in FIG. 15C is formed on the surface of the substrate 5 through the second phase modulation element 12. In this case, if the first strip-like area 12a, the second strip-like area 12b, the third strip-like area 12c and the fourth strip-like area 12d of the second phase modulation element 2 are arranged at equal pitches, peak points at which the light intensity is minimum in the light intensity minimum distribution with the inverse peak shape appear along the Y direction at equal intervals.

Conversely, if the surface of the substrate 5 is set at a defocus position deviating from the focus position with respect to the pattern surface of the second phase modulation element 12, the peak points are shifted in the same direction by the same quantity as shown in FIGS. 15B and D. However, the peak points in the light intensity minimum distribution with the inverse peak shape are maintained in the equal interval state. As a result, intervals of central positions of generated crystal grains become even (symmetry per pitch is maintained), and crystal grains having the same shape are aligned along the Y direction, which is advantageous when producing TFTS on crystal grains.

It is to be noted that the modification illustrated in FIG. 15A adopts a structure in which the second phase modulation element 12 has four types of strip-like areas 12a to 12d having different phase values and a difference in phase value of two strip-like areas adjacent to each other is +90 degrees toward a +Y direction. However, the present invention is not restricted thereto, and it is possible to employ a structure in which the second phase modulation element 12 has three or more types of strip-like areas having different phase values and a difference in phase value of two strip-like areas adjacent to each other has substantially the same value including a sign toward the − direction.

Meanwhile, the second embodiment uses the third phase modulation element 7 having the combined pattern obtained from the pattern of the first phase modulation element 1 according to the first embodiment and the pattern of the second phase modulation element 2 according to the first embodiment, and the third phase modulation element 17 having the combined pattern obtained from the pattern of the first phase modulation element 11 according to the first modification of the first embodiment and the pattern of the second phase modulation element 2 according to the first embodiment. However, it is possible to use the third phase modulation element having a combined pattern obtained from the pattern of the first phase modulation element 1 or the pattern of the first phase modulation element 11 and the pattern of the second phase modulation element 12 according to the modification of FIG. 15.

FIGS. 16A to 16D are views schematically showing an impact of a pupil function of the image formation optical system on the light intensity minimum distribution with the inverse peak shape formed on the substrate through the second phase modulation element according to the first modification of the first embodiment. FIG. 16A shows a pupil function of the image formation optical system 4. If the pupil function of the image formation optical system 4 is fixed from the center to the periphery as indicated by a broken line 100 in FIG. 16A, such unnecessary peaks as indicated by broken line circles 8a are generated in the light intensity minimum distribution with the inverse peak shape obtained in the defocus state as shown in FIGS. 15B to 15D, and the asymmetrical light intensity minimum distribution is obtained. Further, this type of relatively large unnecessary peaks 8a becomes a factor of ablation.

Conversely, if the pupil function of the image formation optical system 4 is smaller at the periphery than at the center as indicated by a solid line 101 in FIG. 16A, for example, if the image formation optical system 4 has the pupil function of a Gaussian distribution in which the pupil function is 60% at the periphery and it is 100% at the center, such small unnecessary peaks as indicated by broken line circles 8b alone are generated in the light intensity minimum distribution with the inverse peak shape obtained in the defocus state as shown in FIGS. 16B and 16D, and collapse of the symmetry of the light intensity minimum distribution in the defocus state is greatly alleviated, which is preferable. It is to be noted that such a pupil function of the Gaussian distribution as indicated by the solid line 101 can be realized by inserting a transmission filter having a predetermined transmittance distribution in the vicinity of an outgoing radiation surface of the second fly-eye lens 3e in the illumination system 3 depicted in FIG. 2.

Figure 17A:
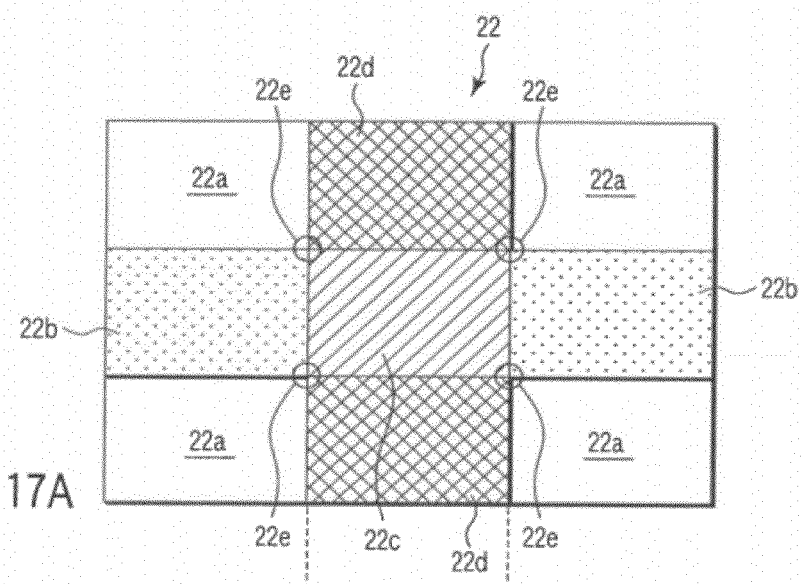
FIG. 17A is a view schematically showing an entire structure of the second phase modulation element according to the second modification of the first embodiment.
Figure 17B:
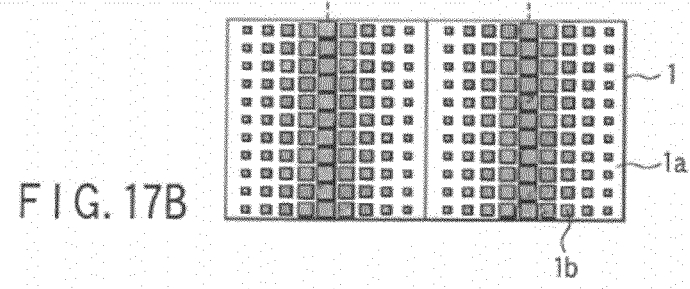
FIG. 17B is a view schematically showing an entire structure of the first phase modulation element in the first embodiment corresponding to the second phase modulation element according to the second modification of the first embodiment depicted in FIG. 17A.

FIG. 17A is a view schematically showing an entire structure of a second phase modulation element according to a second modification of the first embodiment. The hatching in FIG. 17A is provided in order to clarify portions having different phases. FIG. 17B is a view schematically showing an entire structure of the first phase modulation element in the first embodiment corresponding to the second phase modulation element according to the second modification of the first embodiment depicted in FIG. 17A.

The hatching in FIG. 17B is provided in order to clarify first areas 1b. Referring to FIG. 17A, the second phase modulation element 22 according to the second modification has a conformation in which four types of rectangular areas 22a, 22b, 22c and 22d having different phase values are adjacent to each other at predetermined point areas 22e. Specifically, the second phase modulation element 22 has, e.g., first rectangular areas 22a having a phase value of 0 degrees, second rectangular areas 22b having a phase value of 90 degrees, a third rectangular area 22c having a phase value of 180 degrees, and fourth rectangular areas 22d having a phase value of 270 degrees.

Furthermore, four straight lines which intersect crosswise at point areas 22e are constituted in such a manner that they correspond to a boundary between the first rectangular area 22a and the second rectangular area 22b, a boundary between the second rectangular area 22b and the third rectangular area 22c, a boundary between the third rectangular area 22c and the fourth rectangular area 22d, and a boundary between the fourth rectangular area 22d and the first rectangular area 22a. In this case, the point areas 22e constitute shift portions, and there can be obtained a light intensity minimum distribution 22f with a point inverse peak shape in which the light intensity is minimum at the point areas 22e and the light intensity is suddenly increased in all direction toward the periphery as shown in FIG. 18.

Figure 18:
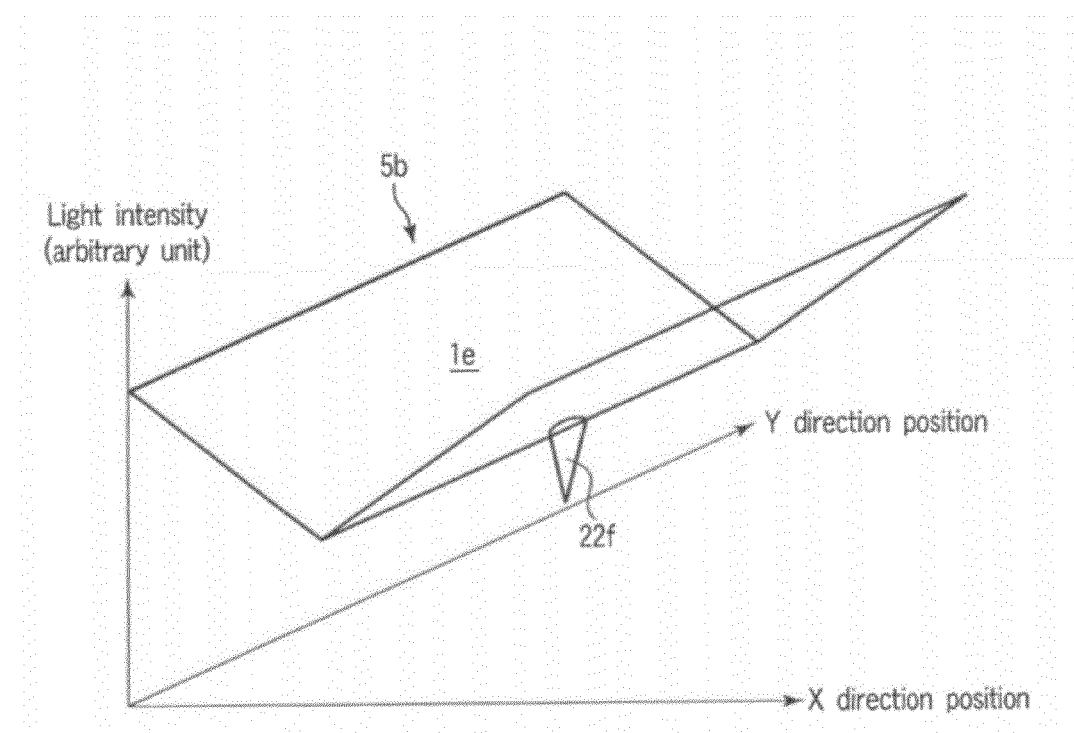
FIG. 18 is a perspective view schematically showing a conformation of a combined light intensity distribution obtained from the V-shaped light intensity gradient distribution formed through the first phase modulation element and the light intensity minimum distribution with the inverse peak shape formed through the second phase modulation element according to the second modification.

Therefore, when the second phase modulation element 22 according to the second modification is used together with the first phase modulation element 1, a combined light intensity distribution obtained from a V-shaped light intensity gradient distribution 1e one-dimensionally having a gradient which is formed through the first phase modulation element 1 and the light intensity minimum distribution 22f having a point inverse peak shape which is formed through the second phase modulation element 22, i.e., a light intensity distribution 5b having the V-shaped pattern and the point inverse peak shape pattern is formed on the surface of the substrate 5, as shown in FIG. 18. Here, referring to the combined light intensity distribution 5a of FIGS. 9C and 9D obtained in the first embodiment, the light intensity minimum distribution 2d having the inverse peak shape has an impact on a part where the light intensity is relatively high in the V-shaped light intensity gradient distribution 1e one-dimensionally having a gradient, and it can be understood that the ideal light intensity distribution is not necessarily obtained.

Conversely, referring to the combined light intensity distribution 5b of FIG. 18 obtained by using the second phase modulation element 22 according to the second modification together with the first phase modulation element 1, the light intensity minimum distribution with the point inverse peak shape affects the bottom portion alone of the V-shaped light intensity gradient distribution 1e one-dimensionally having a gradient in accordance a desired conformation, and it can be understood that the ideal light intensity distribution is obtained. In this case, a crystal nucleus formation position, i.e., a crystal growth start point can be specified at a position of the light intensity minimum distribution 22 with the point inverse peak shape, and the sufficient crystal growth in the lateral direction from a crystal nucleus can be realized along the gradient direction (X direction) of the light intensity in the V-shaped light intensity gradient distribution 1e one-dimensionally having a gradient, thereby crystallizing a non-crystal semiconductor film with a large grain size.

It is to be noted that the second phase modulation element 22 according to the modification of FIG. 17A employs a structure having a conformation in which the four types of rectangular areas 22a, 22b, 22c and 22d having different phase values are adjacent to each other at the predetermined point areas 22e. However, the present invention is not restricted thereto, and it is possible to adopt a structure having a conformation in which three or more types of areas having different phase values are adjacent to each other at predetermined points.

It is to be noted that the light intensity distribution can be calculated on a design stage in each of the foregoing embodiments, but it is desirable to observe and confirm the light intensity distribution on the actual processed surface in advance. In order to realize this, it is sufficient to magnify the processed surface of the substrate 5 and input it by using an imaging element such as a CCD. If a light beam to be used is ultraviolet rays, the optical system is restricted, and hence the light beam may be converted into a visible light beam by providing a fluorescent screen on the substrate.

Figure 19A:
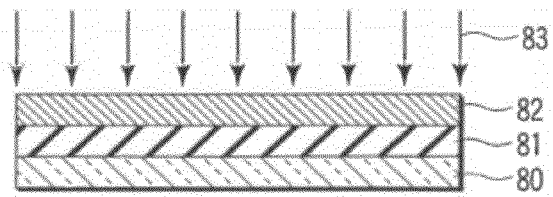
FIGS. 19A to 19E are step cross-sectional views showing steps of manufacturing an electronic device by using a crystallization apparatus according to each embodiment.

FIGS. 19A to 19E are step cross-sectional views showing steps of manufacturing an electronic device in an area crystallized by using the crystallization apparatus according to each embodiment. As shown in FIG. 19A, there is prepared a substrate 5 obtained by forming an underlying film 81 (e.g., a laminated film of SiN with a film thickness of 50 nm and $SiO_2$ with a film thickness of 100 nm) and an amorphous semiconductor film 82 (e.g., Si, Ge, SiGe or the like having a film thickness of approximately 50 nm to 200 nm) on an insulating substrate 80 (e.g., alkaline glass, quartz glass, plastic, polyimide or the like) by a chemical vapor deposition method or a sputtering method. Then, a laser beam 88 (e.g., KrF excimer laser beam or XeCl excimer laser beam) is applied to a predetermined area on the surface of the amorphous semiconductor film 82 by using the crystallized apparatus according to each embodiment.

Figure 19B:
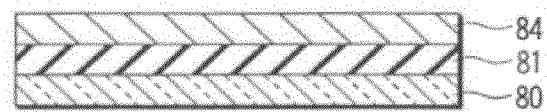
Figure 19C:
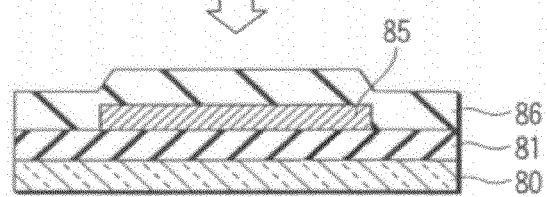
Figure 19D:
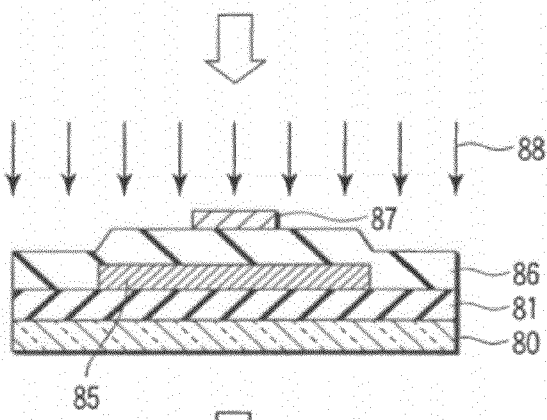
Figure 19E:
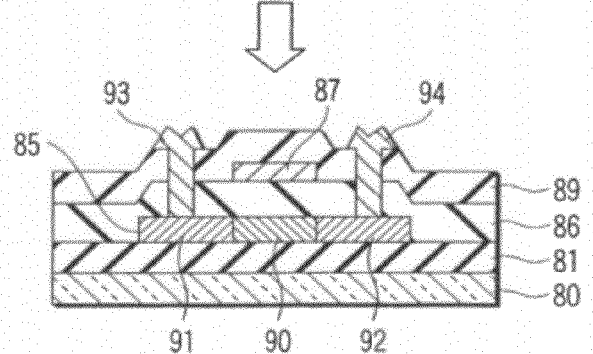

In this manner, as shown in FIG. 19B, a polycrystal semiconductor film or a single-crystallized semiconductor film 84 having crystals with a large grain size is generated. Then, as shown in FIG. 19C, the polycrystal semiconductor film or the single-crystallized semiconductor film 84 is processed into an island-shaped semiconductor film 85 which becomes an area used to form, e.g., a TFT by using a photolithography technique, and an $SiO_2$ film having a film thickness of 20 nm to 100 nm is formed as a gate insulating film 86 on the surface by using, e.g., the chemical vapor deposition method or the sputtering method. Moreover, as shown in FIG. 19D, a gate electrode 87 (e.g., silicide or MoW) is formed on the gate insulating film, and impurity ions 88 (phosphor in the case of an N-channel transistor, and boron in the case of a P-channel transistor) are implanted with the gate electrode 87 being used as a mask. Thereafter, annealing processing (e.g., one hour at 450° C.) is carried out in a nitrogen atmosphere, and a source area 91 and a drain area 92 are formed to the island-shaped semiconductor film 85 by activating the impurities. Then, as shown in FIG. 19E, an interlayer insulating film 89 is formed, contact holes are formed, and a source electrode 93 and a drain electrode 94 which are connected to a source 91 and a drain 92 which are coupled through a channel 90 are formed.

At the above-described steps, a channel 90 is formed in accordance with a position of a crystal with a large grain size of the polycrystal semiconductor film or the single-crystallized semiconductor film 84 formed at the steps depicted in FIGS. 19A and 19B. With the above-described steps, a TFT can be formed to the polycrystal transistor or the single-crystallized semiconductor. The thus manufactured polycrystal transistor or single-crystallized transistor can be applied to a drive circuit for, e.g., a liquid crystal display device (display) or an electroluminescent (EL) display, a memory (SRAM or DRAM) or an integrated circuit such as a CPU.

In the foregoing embodiment, as to the first phase modulation elements 1 and 2, the phase modulation element 2 may be provided on the incident light beam side. Additionally, the first and second phase modulation elements may be integrally provided.

The crystallized apparatus configured in this manner has the image formation optical system 4 provided between the phase modulation elements 1 and 2, and hence it has the following characteristics. At each crystallization step, a distance between the phase modulation elements 1 and 2 and the substrate 5 can be always set constant at a high speed. A tact time of the crystallization step can be improved. Since the image formation optical system 4 is provided between the phase modulation elements 1 and 2 and the substrate 5, even if the ablation phenomenon occurs from the substrate 5 at the crystallization step, products do no adhere to the phase modulation elements.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

This application is related to U.S. Ser. No. 10/949,417, the entire contents of which are incorporated herein by reference, and claims priority under 35 U.S.C. §121 to this application.

What is claimed is:

1. A phase modulation element comprising:
a pattern which forms a light intensity minimum distribution with an inverse peak shape to an incident light beam,
wherein the pattern has three or more types of elongated areas having different phase values, and a difference in phase value of the two elongated areas adjacent to each other has substantially the same value including a sign in one direction from one side to the other side.

2. A phase modulation element comprising:
a pattern which forms a V-shaped light intensity distribution to an incident light beam,
wherein
the phase modulation element has a first area whose minimum dimension is smaller than a predetermined dimension and which has a first phase value and a second area having a second phase value, and has a phase distribution in which area share ratios of the first area and the second area vary depending position, and
the pattern has a linear area, in which the first area and the second area extends parallel to a bottom of the V-shaped light intensity distribution, at a part corresponding to the bottom, and has an isolated area at a part distanced from the part corresponding to the bottom of the V-shaped light intensity distribution.

* * * * *